(12) United States Patent
Fujimori et al.

(10) Patent No.: US 7,280,953 B2
(45) Date of Patent: Oct. 9, 2007

(54) NOISE COUNTERMEASURE DETERMINATION METHOD AND APPARATUS AND STORAGE MEDIUM

(75) Inventors: Shogo Fujimori, Kawasaki (JP); Yasuhiro Yamashita, Kawasaki (JP); Ryoji Yamada, Kawasaki (JP); Masaki Tosaka, Kawasaki (JP); Kazuhiko Tokuda, Kawasaki (JP); Jiro Yoneda, Kawasaki (JP); Makoto Suwada, Kawasaki (JP); Tatsuo Koizumi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 773 days.

(21) Appl. No.: 09/881,732

(22) Filed: Jun. 18, 2001

(65) Prior Publication Data

US 2001/0044709 A1    Nov. 22, 2001

Related U.S. Application Data

(63) Continuation-in-part of application No. 09/750,051, filed on Dec. 29, 2000, now Pat. No. 7,065,480.

(30) Foreign Application Priority Data

May 11, 2000    (JP) .............................. 2000-138681
May 29, 2000    (JP) .............................. 2000-159100
Dec. 25, 2000   (JP) .............................. 2000-393067

(51) Int. Cl.
G06F 17/50    (2006.01)

(52) U.S. Cl. ................. 703/14; 703/1; 716/1

(58) Field of Classification Search ................. 703/14, 703/1; 716/1; 382/173
See application file for complete search history.

(56) References Cited

U.S. PATENT DOCUMENTS

| 5,546,321 | A | * | 8/1996 | Chang et al. ................. 716/1 |
| 5,559,997 | A | * | 9/1996 | Tsuchida et al. ................. 716/1 |
| 5,596,506 | A | * | 1/1997 | Petschauer et al. ............. 716/5 |
| 5,682,336 | A | * | 10/1997 | Chian et al. ..................... 703/3 |
| 5,706,477 | A | * | 1/1998 | Goto ............................... 703/14 |
| 5,999,714 | A | * | 12/1999 | Conn et al. ..................... 716/2 |
| 6,493,658 | B1 | * | 12/2002 | Koford et al. .................. 703/1 |
| 6,597,808 | B1 | * | 7/2003 | Guo et al. ..................... 382/173 |

(Continued)

FOREIGN PATENT DOCUMENTS

JP    7-152824    6/1995

(Continued)

OTHER PUBLICATIONS

The Electrical Engineering Handbook, Second Edition, Richard C. Dorf, CRC Press, 1997, pp. 2265-2272.*

(Continued)

*Primary Examiner*—Paul Rodriquez
*Assistant Examiner*—Dwin McTaggart Craig
(74) *Attorney, Agent, or Firm*—Staas & Halsey LLP

(57) ABSTRACT

A noise countermeasure determination method includes the step of obtaining an analyzing circuit judgement result by judging acceptability of the analyzing circuit based on a comparison of features of the analyzing circuit and transmission circuit topologies, and outputting an improvement proposal for making the analyzing circuit closer to one of basic types of the transmission circuit topologies depending on the analyzing circuit judgement result.

18 Claims, 28 Drawing Sheets

| ERROR CAUSE | COUNTERMEASURE PROPOSAL | TREE JUDGEMENT |
|---|---|---|
| THE DRIVEN ABILITY OF DRIVER IS SMALL INCLUDING THE DAMPING RESISTOR | CHANGE TO DAMPING RESISTOR HAVING SMALL RESISTANCE | SOLUTION FOR RESISTANCE |
| | CHANGE TO DRIVER HAVING LARGE DRIVEN ABILITY | NO SOLUTION FOR RESISTANCE |
| THE DRIVEN ABILITY OF DRIVER IS LARGE INCLUDING THE DAMPING RESISTOR | CHANGE TO DAMPING RESISTOR HAVING LARGE RESISTANCE | |
| | CHANGE TO DRIVER HAVING LARGE DRIVEN ABILITY | DAMPING UNACCEPTABLE |
| THE WIRING IS LONG | SHORTEN THE WIRING LENGTH | |

U.S. PATENT DOCUMENTS 6,732,065 B1 * 5/2004 Muddu .......................... 703/2
6,832,180 B1 * 12/2004 Sutera et al. .................. 703/13

FOREIGN PATENT DOCUMENTS

JP          8-297689          11/1996
JP          9-245076          9/1997
JP          10-097551         4/1998

OTHER PUBLICATIONS

Sharad Mehrotra, Paul Frazon, Michael Steer, "Performance Driven Global Routing and Wireing Rule Generation for High Speed PCBs and MCMs", ACM/IEEE Design Automation Conference 1995 ACM 0-89791-756-1/95/0006, 7 pages.*

* cited by examiner

WIRING TOPOLOGY: LOAD CONCENTRATION TYPE
CHARACTERISTIC IMPEDANCE OF WIRING PATTERN: $Z_0=60\,\Omega$
TRANSMISSION DELAY TIME OF WIRING PATTERN : $T_d=7.0\,ns/m$ WIRING TOPOLOGY: LOAD CONCENTRATION TYPE
CHARACTERISTIC IMPEDANCE OF WIRING PATTERN: $Z_0=60\,\Omega$
TRANSMISSION DELAY TIME OF WIRING PATTERN : $T_d=7.0\,ns/m$ WIRING TOPOLOGY: STAR TYPE
CHARACTERISTIC IMPEDANCE OF WIRING PATTERN: $Z_0=60\Omega$
TRANSMISSION DELAY TIME OF WIRING PATTERN : $T_d=7.0$ ns/m WIRING TOPOLOGY: LOAD CONCENTRATION TYPE
CHARACTERISTIC IMPEDANCE OF WIRING PATTERN: $Z_0=60\Omega$
TRANSMISSION DELAY TIME OF WIRING PATTERN : $T_d=7.0$ ns/m WIRING TOPOLOGY: STAR TYPE
CHARACTERISTIC IMPEDANCE OF WIRING PATTERN: $Z_0=60\,\Omega$
TRANSMISSION DELAY TIME OF WIRING PATTERN : $T_d=7.0\,ns/m$ WIRING TOPOLOGY: LOAD CONCENTRATION TYPE
CHARACTERISTIC IMPEDANCE OF WIRING PATTERN: $Z_0=60\,\Omega$
TRANSMISSION DELAY TIME OF WIRING PATTERN : $T_d=7.0\,ns/m$ FIG. 24
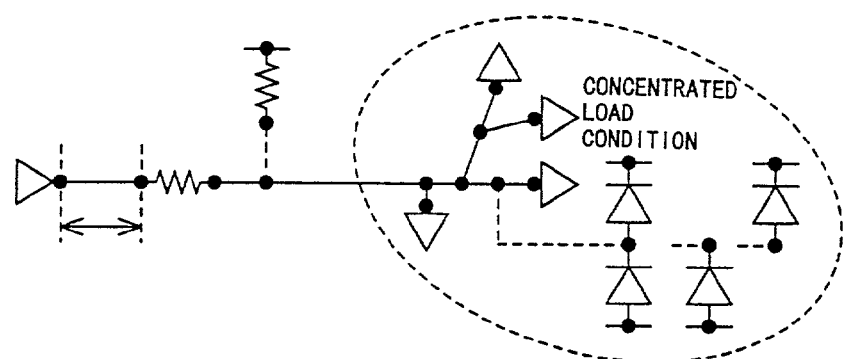
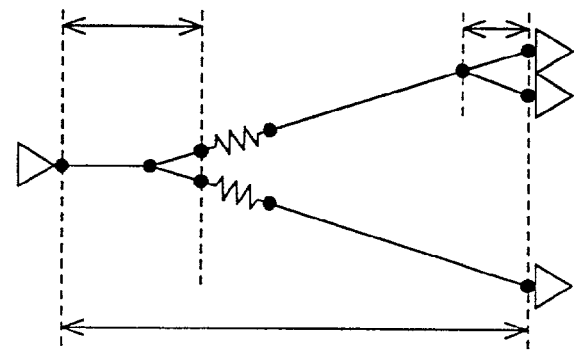
FIG. 25A
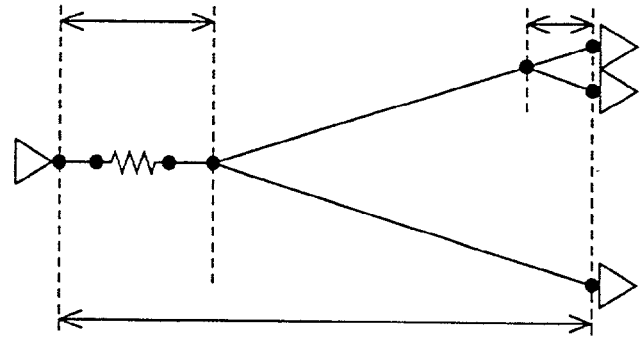
FIG. 25B

FIG.33

| ERROR CAUSE | THE DRIVEN ABILITY OF DRIVER IS SMALL INCLUDING THE DAMPING RESISTOR | THE DRIVEN ABILITY OF DRIVER IS LARGE INCLUDING THE DAMPING RESISTOR | THE WIRING IS LONG | THE DRIVEN ABILITY OF DRIVER IS SMALL INCLUDING THE DAMPING RESISTOR |
|---|---|---|---|---|
| EXCEEDED DELAY | | | × | × |
| EXCEEDED MAXIMUM RATED VOLTAGE | | × | | |
| SMALL RECEIVER VOLTAGE | × | | | × |

FIG.34

| ERROR CAUSE | COUNTERMEASURE PROPOSAL | TREE JUDGEMENT |
|---|---|---|
| THE DRIVEN ABILITY OF DRIVER IS SMALL INCLUDING THE DAMPING RESISTOR | CHANGE TO DAMPING RESISTOR HAVING SMALL RESISTANCE | SOLUTION FOR RESISTANCE |
| | CHANGE TO DRIVER HAVING LARGE DRIVEN ABILITY | NO SOLUTION FOR RESISTANCE |
| THE DRIVEN ABILITY OF DRIVER IS LARGE INCLUDING THE DAMPING RESISTOR | CHANGE TO DAMPING RESISTOR HAVING LARGE RESISTANCE | |
| | CHANGE TO DRIVER HAVING LARGE DRIVEN ABILITY | DAMPING UNACCEPTABLE |
| THE WIRING IS LONG | SHORTEN THE WIRING LENGTH | |

FIG.36

| ERROR CAUSE | THE DRIVEN ABILITY OF DRIVER IS SMALL INCLUDING DAMPING RESISTOR | THE DRIVEN ABILITY OF DRIVER IS LARGE INCLUDING DAMPING RESISTOR | THE WIRING IS LONG | A STEPPED PORTION IS GENERATED |
|---|---|---|---|---|
| EXCEEDED DELAY | | | × | × |
| WAVEFORM DISCONTINUITY | | × | | |
| STEPPED PORTION | × | | | × |

FIG.37

| ERROR CAUSE | COUNTERMEASURE PROPOSAL | SPECIAL CONDITION |
|---|---|---|
| A STEPPED PORTION IS GENERATED | MOVE POSITION OF RECEIVER TOWARDS REMOTE END | RECEIVER POSITION CANNOT BE CHANGED |
| | PROVIDE TERMINATING RESISTOR AT REMOTE END RECEIVER | POSITION CANNOT BE CHANGED |
| | REDUCE RESISTANCE OF DAMPING RESISTOR | CANNOT PROVIDE TERMINATING RESISTOR |
| | CHANGE TO DRIVER HAVING LARGE DRIVEN ABILITY | NO SOLUTION FOR RESITANCE |

NOISE COUNTERMEASURE DETERMINATION METHOD AND APPARATUS AND STORAGE MEDIUM

This application is a Continuation-In-Part Application of a U.S. patent application Ser. No. 09/750,051 filed Dec. 29, 2000 now U.S. Pat. No. 7,065,480.

Further, this application claims the benefit of a Japanese Patent Applications No. 2000-138681 filed May 11, 2000, No. 2000-159100 filed May 29, 2000, and No. 2000-393067 filed Dec. 25, 2000 in the Japanese Patent Office, the disclosures of which are hereby incorporated by reference.

BACKGROUND OF THE INVENTION

1. Field of the Invention

The present invention generally relates to noise countermeasure determination methods and apparatuses and storage media, and more particularly to a noise countermeasure determination method which determines noise countermeasures for guaranteeing a normal operation of an electronic circuit by minimizing noise which may be generated in the electronic circuit when designing the electronic circuit such as a large scale integrated (LSI) circuit, multi-chip module (MCM) and printed circuit board (PCB), and to a noise countermeasure determination apparatus which determines the noise countermeasures by such a noise countermeasure determination method, and to a computer-readable storage medium which stores a program for causing a computer to carry out such a noise countermeasure determination.

Recently, the noise countermeasures and noise analysis have become important when designing the electronic circuit, particularly because the size of electronic circuits has decreased considerably and the operation speed of the electronic circuits has increased greatly. The noise countermeasures refer to various measures which are taken to suppress the noise generated in the electronic circuit, based on results obtained by the noise analysis.

2. Description of the Related Art

Conventionally, various kinds of noise analyzing tools have been proposed to carry out the noise analysis when designing the electronic circuit. The noise analyzing tool carries out the noise analysis and a noise check using a circuit simulator after a layout design of the electronic circuit is made, so as to determine noise countermeasures for suppressing the noise. The design of the electronic circuit is modified if necessary based on the determined noise countermeasures. After such a design modification, the noise analysis and the noise check are carried out again, and the above described procedure is repeated until the noise falls within a tolerable range.

The noise which is to be mainly considered when designing the electronic circuit includes reflection noise and crosstalk noise. Normally, the reflection noise is generated by a mismatch of an internal resistance of a driver element and a characteristic impedance of a transmission line. In order to suppress the reflection noise, a method has been proposed to insert a damping resistor in series to an output of the driver element particularly in the case of a 1:1 transmission. According to this proposed method, a resistance of the damping resistor is selected so that a sum of the internal resistance of the driver element and the damping resistance becomes equal to the characteristic impedance of the transmission line.

The reflection noise in transmissions other than the 1:1 transmission, such as a 1:N transmission, greatly depends on the wiring (or routing) topology. For this reason, the wiring topology is selected manually, so as to carry out the wiring to suit the wiring topology selected by the designer. Accordingly, the circuit simulator carries out the noise analysis and the noise check based on the wiring information. If noise exceeding a tolerable range exists as a result of the noise analysis, operations such as a modification of the wiring topology, a rewiring to suit the wiring topology, a noise analysis and a noise check are repeated so as to find an optimum wiring topology.

On the other hand, the crosstalk noise greatly depends on the driven ability of the driver element, a gap between adjacent patterns, and the like. Usually, the crosstalk analysis requires information related to the adjacent patterns, and for this reason, the noise analysis and the noise check are carried out after the layout design of the electronic circuit is made, using layout design data. The information related to the adjacent patterns include a pattern gap, a distance for which the patterns run parallel to each other, a position where the patterns are parallel on the transmission lines, and the like.

However, due to the further size reduction and the further increased operation speed of recent electronic circuits, the number of nets which require the noise analysis and the noise check is increasing, thereby increasing the number of design steps. A net refers to a part which is made up of at least one target circuit element when designing the electronic circuit. For this reason, it is necessary to take noise countermeasures not requiring a backward process which is a repetition of manual operations including circuit design, layout design and noise analysis. In other words, prior to the circuit design and the layout design, it is necessary to create a circuit model amounting to at least one net, so as to determine the noise countermeasures based on the circuit model input.

But even in a case where the circuit model amounting to at least one net is created and the noise analysis and the noise countermeasures are carried out, before the circuit design and the layout design, a processing time as a whole becomes considerably long if the noise countermeasures are always determined by the circuit simulator, since a processing time of the circuit simulator is long compared to other processes. Consequently, the problem of the considerably long processing time of the circuit simulator becomes particularly conspicuous when repeating operation cycles such as design, analysis, countermeasures (design modification) and analysis. For this reason, there were demands to determine the noise countermeasures by suppressing the operation of the circuit simulator to a minimum.

In order to suppress the operation of the circuit simulator to a minimum, it is necessary to select the damping resistance without using the results of the circuit simulator, even for the countermeasures against the reflection noise. However, if the damping resistance which matches the output resistance of the driver element and the characteristic impedance of the wiring is used as the recommended circuit information, this damping resistance will not match the damping resistance which is already inserted in the input circuit information, even though a problem will not occur in the actual transmission waveform. As a result, there was a problem in that the noise countermeasures which are determined in such a case may be too severe and require the damping resistor to be modified.

In addition, when determining the wiring topology, it is necessary to repeat the wiring topology selection, wiring modification and noise analysis. But if the wiring topology selection and the wiring modification are to be made by the designer, there was a problem in that it takes too long to carry out such operations manually. For this reason, there were demands to repeat the wiring topology selection, wiring modification and noise analysis within a short time, and to determine the noise countermeasures by selecting an optimum wiring topology.

Furthermore, according to the crosstalk noise analyzing method described above, the noise analysis and the noise check are made using the design data after the layout design. Accordingly, when the crosstalk noise is found as a result of the noise check, the layout design must be modified with a backward process which repeats manual operations. Consequently, there were demands to reduce the design steps by eliminating the backward process which repeat manual operations.

SUMMARY OF THE INVENTION

Accordingly, it is a general object of the present invention to provide a novel and useful noise countermeasure determination method and apparatus and computer-readable storage medium, in which the problems described above are eliminated.

A first object of the present invention is to provide a noise countermeasure determination method and apparatus and computer-readable storage medium which can determine noise countermeasures before a circuit design and a layout design, and suppress an operation of a circuit simulator to a minimum when determining the noise countermeasures, so that the noise countermeasures can be determined at a high speed without generating in design steps a backward process which is a repetition of manual operations.

A second object of the present invention is to provide a noise countermeasure determination method and apparatus and computer-readable storage medium which can determine a damping resistance without the need to carry out an operation of a circuit simulator and without making the noise countermeasures too severe.

A third object of the present invention is to provide a noise countermeasure determination method and apparatus and computer-readable storage medium which can determine an optimum wiring topology from relative positional relationships on an actual printed circuit board or the like, prior to a circuit design and a layout design.

A fourth object of the present invention is to provide a noise countermeasure determination method and apparatus and computer-readable storage medium which can determine noise countermeasures by taking crosstalk noise into consideration, by analyzing the crosstalk noise prior to a circuit design and a layout design.

A fifth object of the present invention is to provide a noise countermeasure determination method and apparatus and computer-readable storage medium which can automatically select an improvement proposal for an analyzing circuit, and select an optimum improvement proposal within a short processing time regardless of a degree of skill of the user.

Another and more specific object of the present invention is to provide a noise countermeasure determination method and apparatus and computer-readable storage medium, which can suppress the operation of a circuit simulator to a minimum when determining noise countermeasures, so that the noise countermeasures can be determined at a high speed without generating in the design steps a portion which requires a backward process which is a repetition of manual operations.

Still another object of the present invention is to provide a noise countermeasure determination method comprising the steps of (a) calculating recommended circuit information considered to minimize a noise by use of at least one formula, based on input circuit information amounting to at least one net of a target circuit which is to be subjected to a noise analysis, and (b) comparing the input circuit information and the recommended circuit information, and determining a differing portion of the recommended circuit information differing from the input circuit information, as noise countermeasures. According to the noise countermeasure determination method of the present invention, it is possible to realize the first object described above.

The noise countermeasure determination method may further comprise the steps of (c) creating a simulation model of the input circuit information after determining the noise countermeasures in the step (b), (d) carrying out a circuit simulation using the simulation model, to calculate a signal waveform propagating through a wiring of the target circuit and to check whether or not a noise exceeding a tolerable range exists in the signal waveform, and (e) categorizing the noise existing as a result of the noise check carried out in the step (d), and optimizing the determined noise countermeasures to only portions related to the noise. According to the noise countermeasure determination method of the present invention, it is possible to realize the second object described above.

The noise countermeasure determination method may further comprises the step of (c) outputting input circuit information which includes as, a wiring length, a Manhattan distance which is determined based on positions of part pins forming the target circuit and a wiring topology. According to the noise countermeasure determination method, it is possible to realize the third object described above.

The noise countermeasure determination method may further comprise the steps of (c) creating a simulation model of input circuit information made up of circuit information of a target net which is to be subjected to the noise analysis and circuit information of an adjacent net which is adjacent to the target net, after determining the noise countermeasures in the step (b), (d) carrying out a circuit simulation using the simulation model, to obtain a noise synthesized waveform by combining a crosstalk noise waveform and a signal waveform propagating through the target net which are calculated, and to check whether or not a noise exceeding a tolerable range exists based on the noise synthesized waveform, and (e) categorizing the noise existing as a result of the noise check carried out in the step (d), and optimizing the determined noise countermeasures to only portions related to the noise. According to the noise countermeasure determination method of the present invention, it is possible to realize the fourth object described above.

A further object of the present invention is to provide a noise countermeasure determination apparatus comprising a recommended circuit information calculating section calculating recommended circuit information considered to minimize a noise by use of at least one formula, based on input circuit information amounting to at least one net of a target circuit which is to be subjected to a noise analysis, and a noise countermeasure determination section comparing the input circuit information and the recommended circuit information, and determining a differing portion of the recommended circuit information differing from the input circuit information, as noise countermeasures. According to the noise countermeasure determination apparatus of the preset invention, it is possible to realize the first object described above.

Another object of the present invention is to provide a computer-readable storage medium which stores a program for causing a computer to determine noise countermeasures, where the program comprises a recommended circuit information calculating procedure causing the computer to calculate recommended circuit information considered to minimize a noise by use of at least one formula, based on input circuit information amounting to at least one net of a target circuit which is to be subjected to a noise analysis, and a noise countermeasure determination procedure causing the computer to compare the input circuit information and the recommended circuit information, and to determine a differing portion of the recommended circuit information differing from the input circuit information, as noise countermeasures. According to the computer-readable storage medium of the present invention, it is possible to realize the first object described above.

Still another object of the present invention is to provide a noise countermeasure determination method comprising the step of obtaining an analyzing circuit judgement result by judging acceptability of the analyzing circuit based on a comparison of features of the analyzing circuit and transmission circuit topologies, and outputting an improvement proposal for making the analyzing circuit closer to one of basic types of the transmission circuit topologies depending on the analyzing circuit judgement result. According to the noise countermeasure determination method of the present invention, it is possible to realize the fifth object described above.

A further object of the present invention is to provide a noise countermeasure determination apparatus comprising a circuit acceptability judging and output means for obtaining an analyzing circuit judgement result by judging acceptability of the analyzing circuit based on a comparison of features of the analyzing circuit and transmission circuit topologies, and outputting an improvement proposal for making the analyzing circuit closer to one of basic types of the transmission circuit topologies depending on the analyzing circuit judgement result. According to the noise countermeasure determination apparatus of the present invention, it is possible to realize the fifth object described above.

Another object of the present invention is to provide a computer-readable storage medium which stores a program for causing a computer to determine a noise countermeasure with respect to an analyzing circuit which is to be analyzed, wherein the program comprises a circuit acceptability judging and output procedure which causes the computer to obtain an analyzing circuit judgement result by judging acceptability of the analyzing circuit based on a comparison of features of the analyzing circuit and transmission circuit topologies, and to output an improvement proposal for making the analyzing circuit closer to one of basic types of the transmission circuit topologies depending on the analyzing circuit judgement result. According to the computer-readable storage medium of the present invention, it is possible to realize the fifth object described above.

Therefore, according to the present invention, it is possible to realize a noise countermeasure determination method and apparatus and computer-readable storage medium, which can suppress the operation of a circuit simulator to a minimum when determining noise countermeasures, so that the noise countermeasures can be determined at a high speed without generating in the design steps a portion which requires a backward process which is a repetition of manual operations.

Other objects and further features of the present invention will be apparent from the following detailed description when read in conjunction with the accompanying drawings.

BRIEF DESCRIPTION OF THE DRAWINGS

FIG. 24 is a diagram showing a load concentration type wiring topology for a unidirectional transmission;

FIGS. 25A and 25B respectively are diagrams showing a star type wiring topology for the unidirectional transmission;

FIG. 33 is a diagram showing analyzing items of the error cause for a 1:1 type transmission circuit topology;

FIG. 34 is a diagram for explaining an improvement proposal file for the case of FIGS. 32 and 33;

FIG. 36 is a diagram showing analyzing items of the error cause for a daisy chain type transmission circuit topology; and FIG. 37 is a diagram for explaining an improvement proposal file for the case of FIGS. 35 and 36.

DESCRIPTION OF THE PREFERRED EMBODIMENTS

Figure 1:
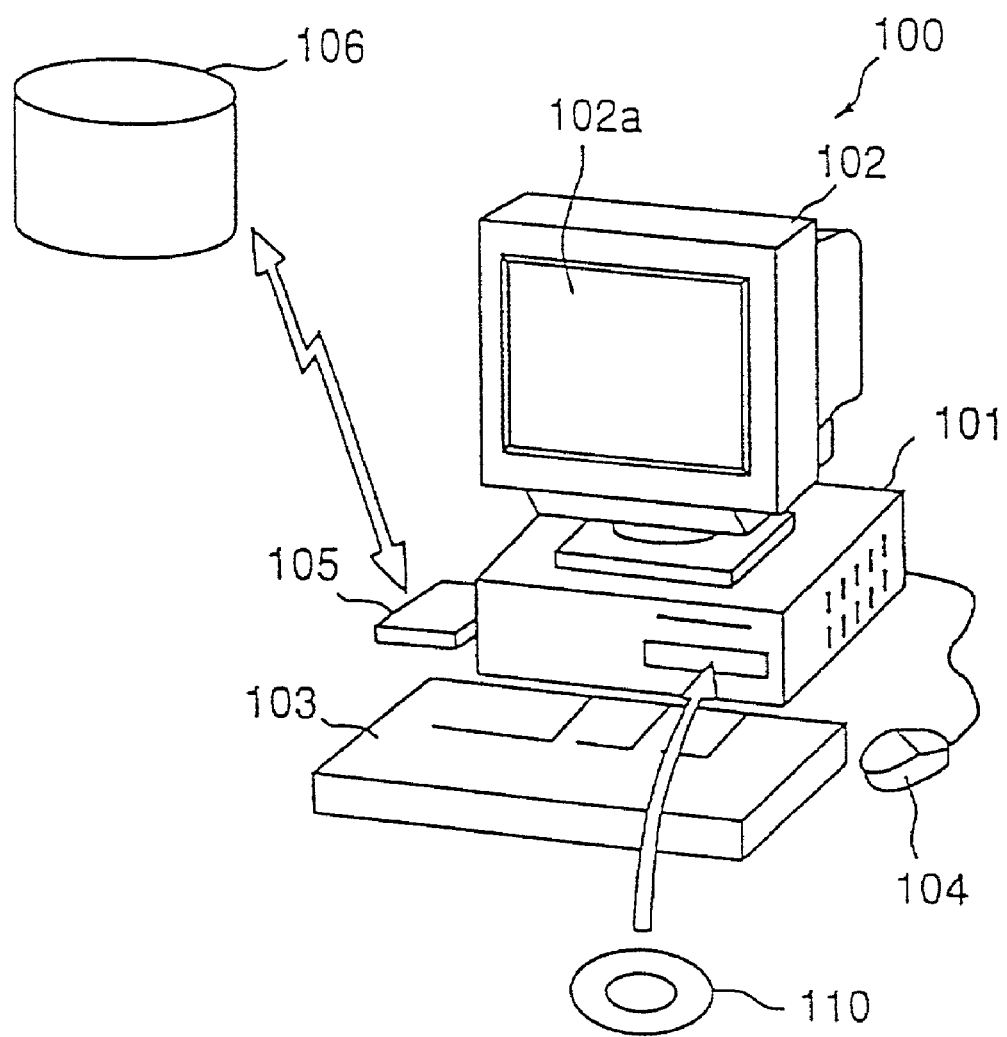
FIG. 1 is a perspective view showing a computer system applied with the present invention in a first embodiment of the present invention.

A description will be given of various embodiments of a noise countermeasure determination method, a noise countermeasure determination apparatus and a computer-readable storage medium according to the present invention, by referring to the drawings.

First, a description will be given of a first embodiment of the noise countermeasure determination apparatus according to the present invention. This first embodiment of the noise countermeasure determination apparatus employs a first embodiment of the noise countermeasure determination method according to the present invention and a first embodiment of the computer-readable storage medium according to the present invention. In this first embodiment, the present invention is applied to a computer system. FIG. 1 is a perspective view showing the computer system to which the present invention is applied in this first embodiment. It is assumed for the sake of convenience that the computer system shown in FIG. 1 is also used in each of second and subsequent embodiments which will be described later.

A computer system 100 shown in FIG. 1 is generally provided with a main body 101 which includes a CPU, a disk drive and the like, a display 102 which includes a display screen 102a for displaying an image in response to an instruction from the main body 101, a keyboard 103 which is used to input various information to the computer system 100, a mouse 104 which is used to specify an arbitrary position on the display screen 102a of the display 102, and a modem 105 which is used to access an external database or the like and to download programs or the like stored in another computer system.

A noise countermeasure determination program (or a noise countermeasure determination software) which causes the computer system 100 to have a noise countermeasure determination function is stored in a portable recording medium such as a disk 110 or, is downloaded from a recording medium 106 of another computer system using a communication unit such as the modem 105. The computer-readable storage medium according to the present invention is formed by a recording medium, such as the disk 110, which stores the noise countermeasure determination program. The recording medium forming the computer-readable storage medium according to the present invention is not limited to portable recording media such as the disk 110, IC card memory, floppy disk, magneto-optical disk and CD-ROM, but also includes various kinds of recording media which are accessible by a computer system which is coupled via the communication unit or communication means such as the modem 105 and LAN.

Figure 2:
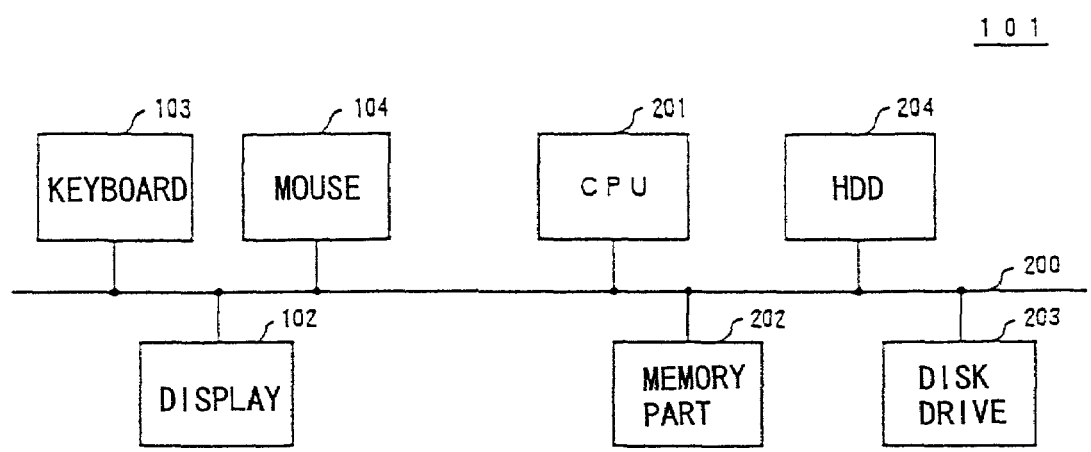
FIG. 2 is a system block diagram for explaining a construction of an important part within a main body of the computer system.

FIG. 2 is a system block diagram for explaining the structure of an important part within the main body 101 of the computer system 100. In FIG. 2, the main body 101 generally includes a CPU 201, a memory part 202 made of RAM, ROM or the like, a disk drive 203 for the disk 110, and a hard disk drive (HDD) 204 which are connected via a bus 200. The display 102, the keyboard 103, the mouse 104 and the like may be connected to the CPU 201 via the bus 200 as shown in FIG. 2 or, connected directly to the CPU 201. It is also possible to connect the display 102 to the CPU 201 via a known graphic interface (not shown) which carries out an input/output image data processing.

Of course, the structure of the computer system 100 is not limited to that shown in FIGS. 1 and 2, and various other known structures may be used instead.

Figure 3:
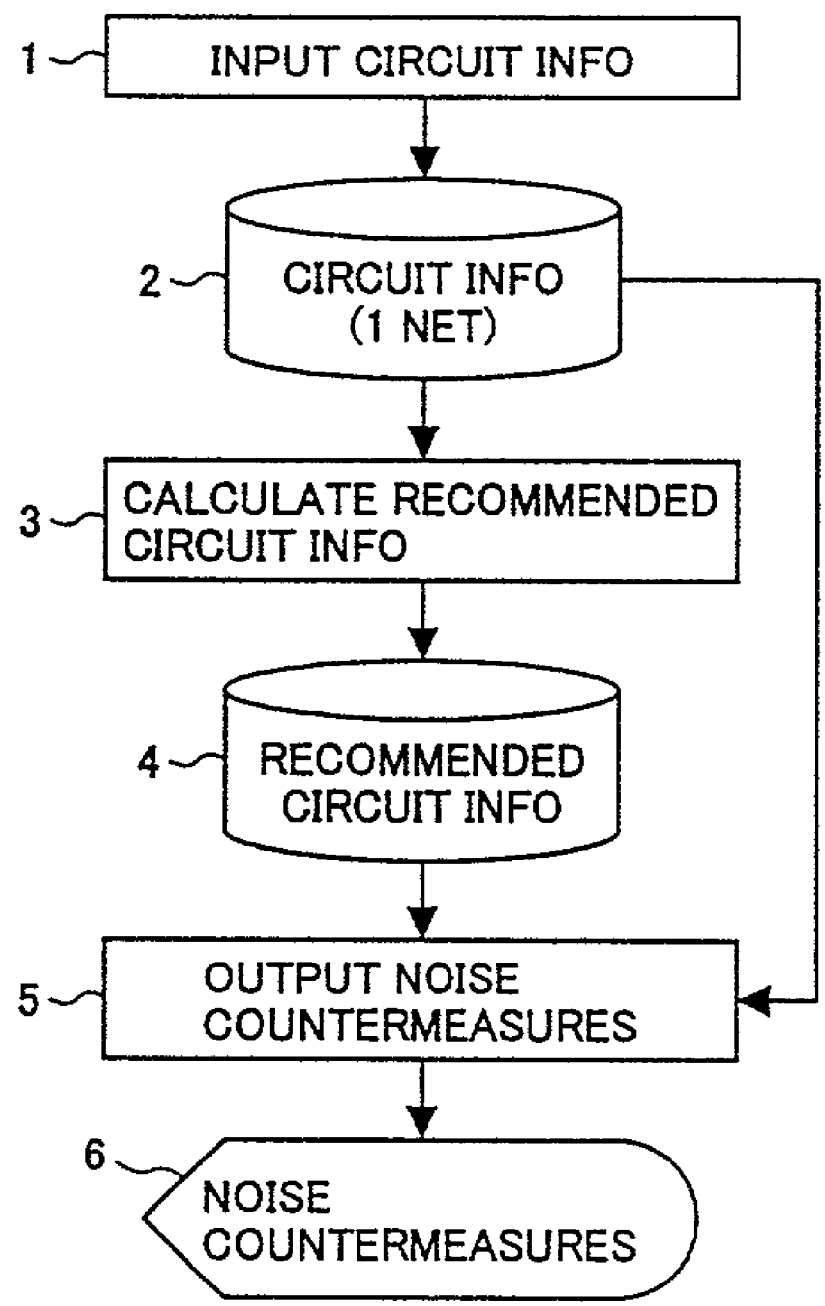
FIG. 3 is a flow chart for explaining a noise countermeasure determination process of a CPU in the first embodiment.

FIG. 3 is a flow chart for explaining a noise countermeasure determination process of the CPU 201 in this first embodiment. In this embodiment, noise countermeasures are determined without the use of a circuit simulator, before a circuit design and a layout design of a target electronic circuit are made. In FIG. 3, when the noise countermeasure determination process is started, a step 1 inputs input circuit information amounting to at least one net of a target electronic circuit from the keyboard 103 or an external unit. A step 2 stores the input circuit information in a storage means such as the memory part 202. A step 3 calculates recommended circuit information which is considered to minimize noise using at least one calculation formula, based on the input circuit information read from the memory part 202. The recommended circuit information includes a damping resistance, a wiring length between a driver element and a resistor, a wiring length between a resistor and a receiver element, a position of a wiring branching point, a wiring length between a resistor and a branching point, a wiring length between a branching point and a receiver element, a driven ability of a driver element, a number of loads (receiver elements), and the like. A step 4 stores the calculated recommended circuit information in a storage means such as the memory part 202. A step 5 compares the input circuit information and the recommended circuit information read from the memory part 202, and determines differing portions of the recommended circuit information as noise countermeasures. A step 6 outputs the determined noise countermeasures by displaying the noise countermeasures on the display 102, for example.

Figure 4:
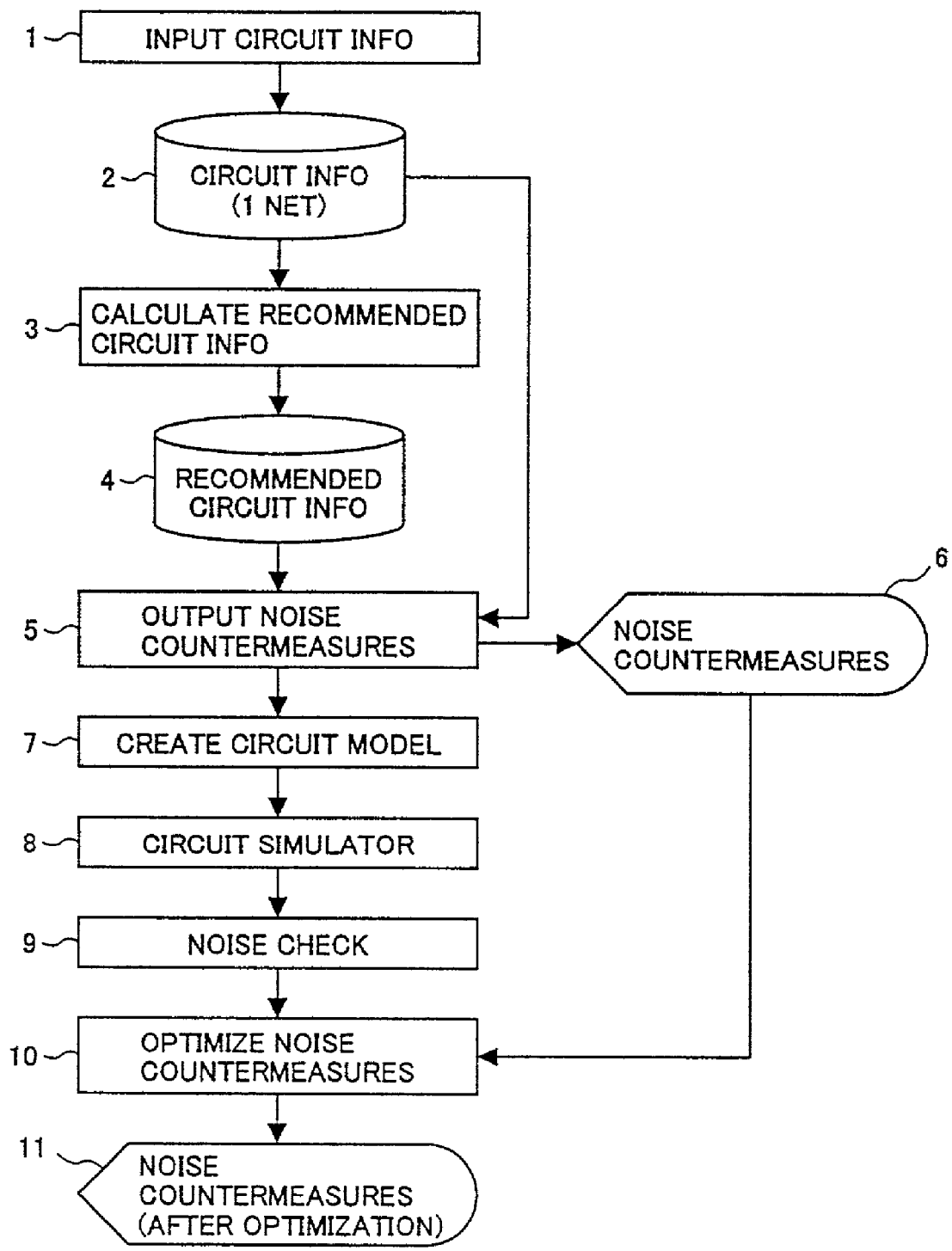
FIG. 4 is a flow chart for explaining a noise countermeasure determination process of the CPU in a second embodiment of the present invention.

FIG. 4 is a flow chart for explaining a noise countermeasure determination process of the CPU 201 of the computer system 100 which is applied with a second embodiment of the noise countermeasure determination method, a second embodiment of the noise countermeasure determination apparatus and a second embodiment of the computer-readable storage medium according to the present invention. In FIG. 4, those steps which are the same as those corresponding steps in FIG. 3 are designated by the same reference numerals, and a description thereof will be omitted. In this second embodiment, the noise countermeasures determined by the first embodiment described above are further optimized using analysis results of a circuit simulator, so as to determine more restricted noise countermeasures.

In FIG. 4, a step 7 creates a circuit mode, that is, a simulation model, based on the noise countermeasures obtained by the step 5. A step 8 analyzes the created circuit model using a circuit simulator. A step 9 checks whether or not a noise which cause problems, that is, a noise exceeding a tolerable range, is generated, based on the analysis results of the circuit simulator. The noise check is made by detecting the noise existing in a signal waveform propagating through a wiring of the electronic circuit, for example, which signal waveform is output from the circuit simulator. A step 10 categorizes results of the noise check, and restricts the noise countermeasures output by the step 6 to only portions related to the categorized results of the noise check. A step 11 outputs the restricted noise countermeasures by displaying the restricted noise countermeasures on the display 102, for example.

According to the first and second embodiments described above, it is possible to determine the noise countermeasures before the circuit design and the layout design of the target electronic circuit, by inputting the circuit information amounting to at least one net. In addition, by obtaining the recommended circuit information based on the at least one calculation formula, it is possible to determine the noise countermeasures by suppressing the operation of the circuit simulator to a minimum as in the second embodiment.

Figure 5:
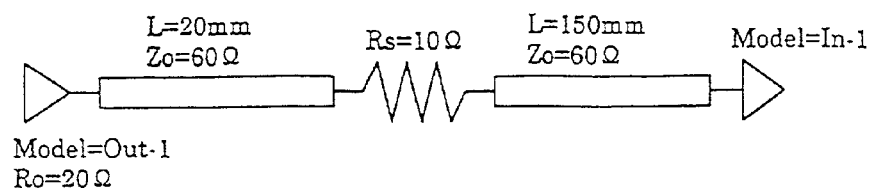
FIG. 5 is a diagram for explaining input circuit information.

In the second embodiment, the input circuit information which is input in the step 1 is, for example, information amounting to one net shown in FIG. 5. The input circuit information shown in FIG. 5 includes a driver element with a resistance R0=20 Ohms (Ω), a wiring having a wiring length L=20 mm and an impedance Z0=60 Ohms, a resistor having a resistance Rs=20 Ohms, a wiring having a wiring length L=20 mm and an impedance Z0=60 Ohms, and a receiver element. In this case, a clock frequency of the net, a delay between pins, a signal propagation speed on a pattern, a layer structure, a pattern width and the like may be input in addition to the input circuit information shown in FIG. 5.

The step 3 obtains the recommended circuit information which is considered to minimize the noise using the at least one calculation formula, based on the input circuit information. It will be assumed for the sake of convenience that the recommended circuit information which is obtained based on the input circuit information shown in FIG. 5 includes a damping resistance. For example, when the step 8 calculates based on the input circuit information shown in FIG. 5 that a damping resistance at which a first rising voltage of an input waveform matches a maximum voltage VIH-2 which guarantees a normal operation of the circuit is 12 Ohms, and a damping resistance at which the first rising voltage of the input waveform matches a minimum voltage VIH-1 which guarantees the normal operation of the circuit is 67 Ohms, the damping resistance of the recommended circuit information becomes 12 to 67 Ohms.

Figure 6:
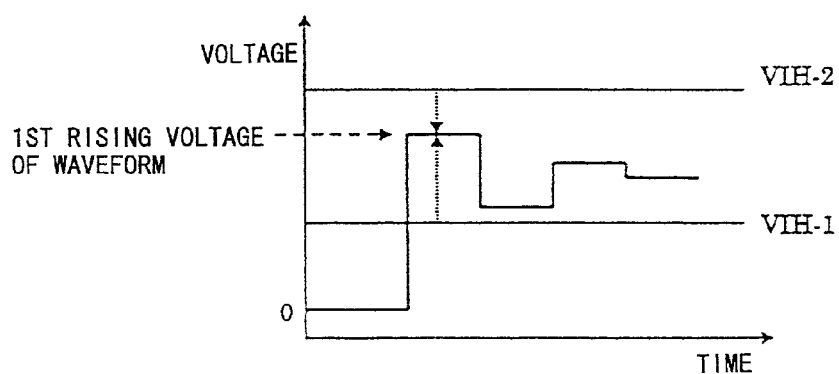
FIG. 6 is a diagram showing a relationship of a first rising voltage, and a maximum voltage and a minimum voltage of a circuit.

FIG. 6 is a diagram showing a relationship of the first rising voltage, and the maximum voltage VIH-2 and the minimum voltage VIH-1 of the circuit. In FIG. 6, the ordinate indicates the voltage, and the abscissa indicates the time. In this case, the step 5 obtains, as the noise countermeasures, a damping resistance which makes the first rising voltage indicated by a dotted line in FIG. 6 to fall within a range less than or equal to the maximum voltage VIH-2 and greater than or equal to the minimum voltage VIH-1. In other words, because the damping resistance of the input circuit information is 10 Ohms and the damping resistance of the recommended circuit information is 12 to 67 Ohms, the step 5 compares the damping resistances and determines the noise countermeasures as being to modify the damping resistance of the input circuit information to the damping resistance of the recommended circuit information, which is 12 to 67 Ohms.

Figure 7:
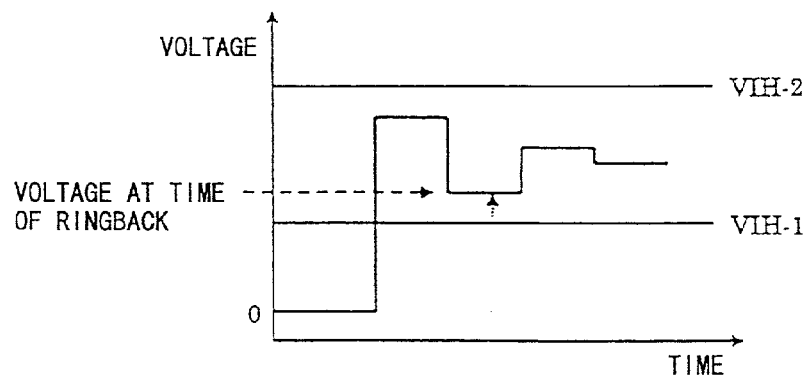
FIG. 7 is a diagram for explaining a relationship of the voltage and the minimum voltage of the circuit at a time of a ringback.

When calculating the damping resistance based on the input circuit information shown in FIG. 5, it is possible to take into consideration a voltage at the time of a ringback. It is assumed for the sake of convenience that a damping resistance at which the voltage at the time of the ringback matches the minimum voltage VIH-1 of the circuit is calculated to be 14 Ohms. In this case, a damping resistance at which the first rising voltage of the input waveform matches the maximum rated voltage of the circuit is 12 Ohms, but the damping resistance of 14 Ohms at the time of the ringback is used as a minimum value of the damping resistance. Hence, the damping resistance of the recommended circuit information becomes 14 to 67 Ohms. FIG. 7 is a diagram showing a relationship of the voltage at the time of the ringback and the minimum voltage VIH-1 of the circuit. In FIG. 7, the ordinate indicates the voltage, and the abscissa indicates the time. Accordingly, the noise countermeasures, that is, the damping resistance, are determined in this case so that in addition to the first rising voltage, the voltage at the time of the ringback indicated by a dotted line in FIG. 7 falls within a range greater than or equal to the minimum voltage VIH-1 of the circuit.

Figure 8:
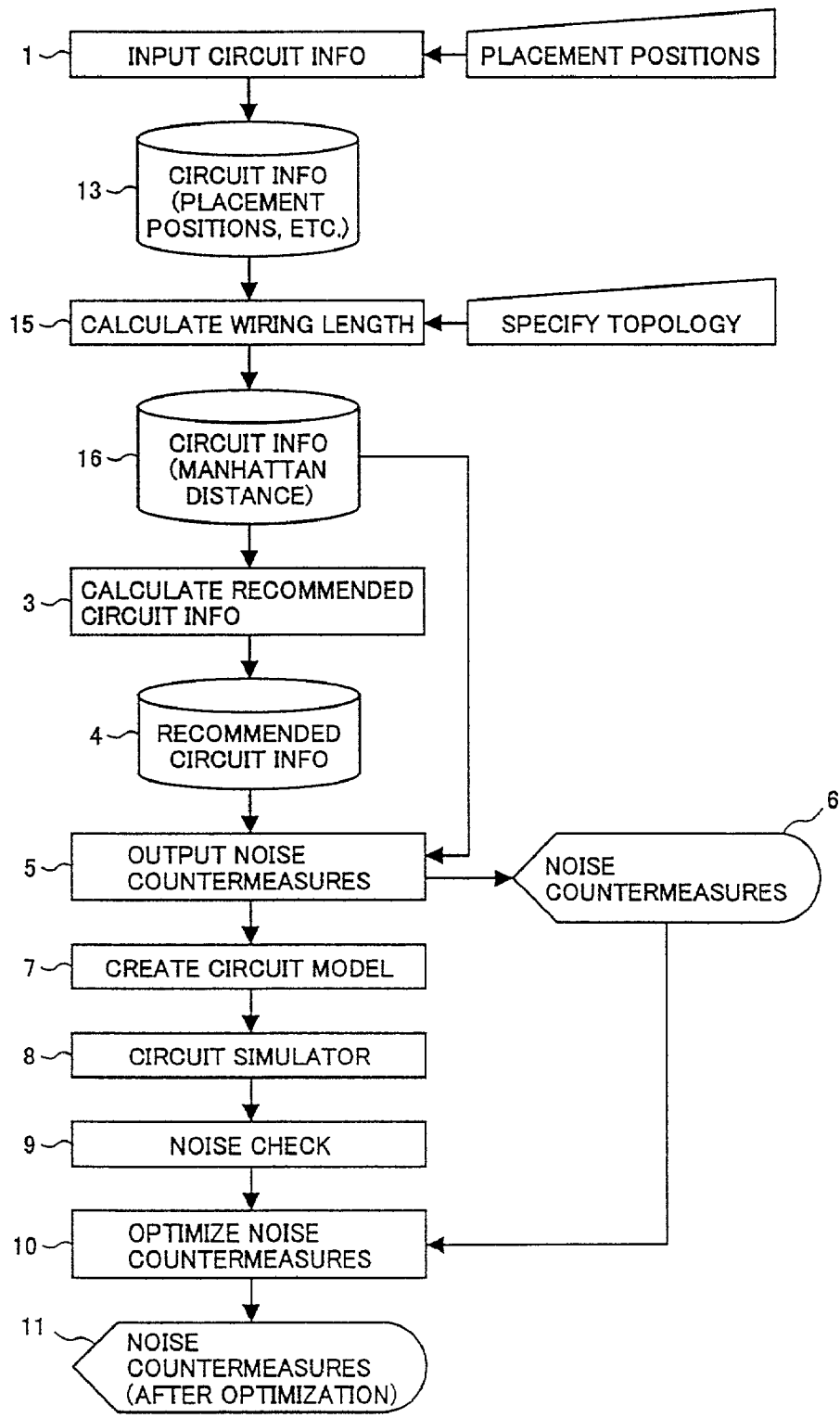
FIG. 8 is a flow chart for explaining a noise countermeasure determination process of the CPU in a third embodiment of the present invention.

FIG. 8 is a flow chart for explaining a noise countermeasure determination process of the CPU 201 of the computer system 100 which is applied with a third embodiment of the noise countermeasure determination method, a third embodiment of the noise countermeasure determination apparatus and a third embodiment of the computer-readable storage medium according to the present invention. In FIG. 8, those steps which are the same as those corresponding steps in FIG. 4 are designated by the same reference numerals, and a description thereof will be omitted. In order to omit input of routing and wiring length information when inputting the input circuit information, this third embodiment inputs positions of part pins such as input/output (I/O) buffers forming the circuit, and uses a Manhattan distance which is obtained from the positions of the part pins and the wiring topology, as the wiring length.

In FIG. 8, in order to omit the input of the routing and wiring length information, the step 1 inputs the positions of the part pins forming the circuit, that is, the placement positions, as the input circuit information. Hence, a step 13 stores the placement positions, as the input circuit information, in a storage means such as the memory part 202. A step 15 calculates, as the wiring length, the Manhattan distance or a provisional wiring length based on the placement positions which are read from the memory part 202 as the input circuit information and the specified wiring topology. A step 16 stores the calculated wiring length, as the circuit information, in a storage means such as the memory part 202. Hence, the step 3 in this embodiment calculates the recommended circuit information based on the wiring length, that is, the Manhattan distance.

Figure 9:
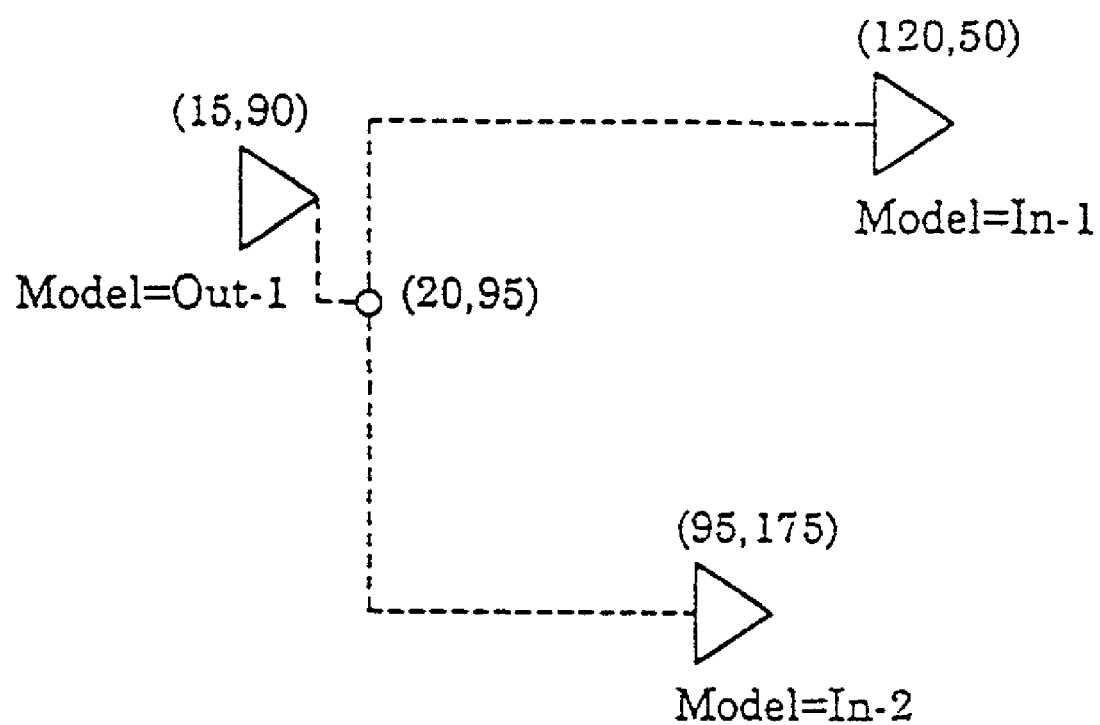
FIG. 9 is a diagram showing a case where placement positions of input/output buffers are input without routing of wirings.

Next, a description will be given of a case where the Manhattan distance which is obtained from the placement positions of the input/output buffers and the wiring topology, as the wiring length. FIG. 9 is a diagram showing a case where the placement positions of the input/output buffers are input without routing of the wirings. In FIG. 9, coordinates indicated in brackets indicate placement positions of the input/output buffers. In this case, an output buffer (driver element) is placed at the coordinate (15, 90), and an input buffer (receiver element) is placed at each of the coordinates (120, 50) and (95, 175). When a "star type" wiring topology is specified, the step 15 first calculates the position of a branching point as being (20, 95) so as to suit the wiring topology. In other words, since the specified wiring topology is the "star type", the position of the branching point is determined so that the Manhattan distance from the branching point to the receiver element becomes the same for the two receiver elements and the distance from the driver element to the branching point becomes as short as possible. In the case shown in FIG. 9, the wiring length from the driver element to the branching point is calculated as being 15 mm, and the wiring length from the driver element to each of the two receiver elements is calculated as being 150 mm, from the Manhattan distance, when the units of the coordinates are regarded as being in mm. Thereafter, these wiring lengths are used as the wiring length of the input circuit information.

In a modification, the wiring topology is not specified, the selectable wiring topologies are defined in advance, and the wiring length is calculated from the Manhattan distance by successively changing the wiring topology. In this case, the selectable wiring topologies may include the "star type", "load concentration type", "daisy chain type", "H-type" and the like.

Figure 10:
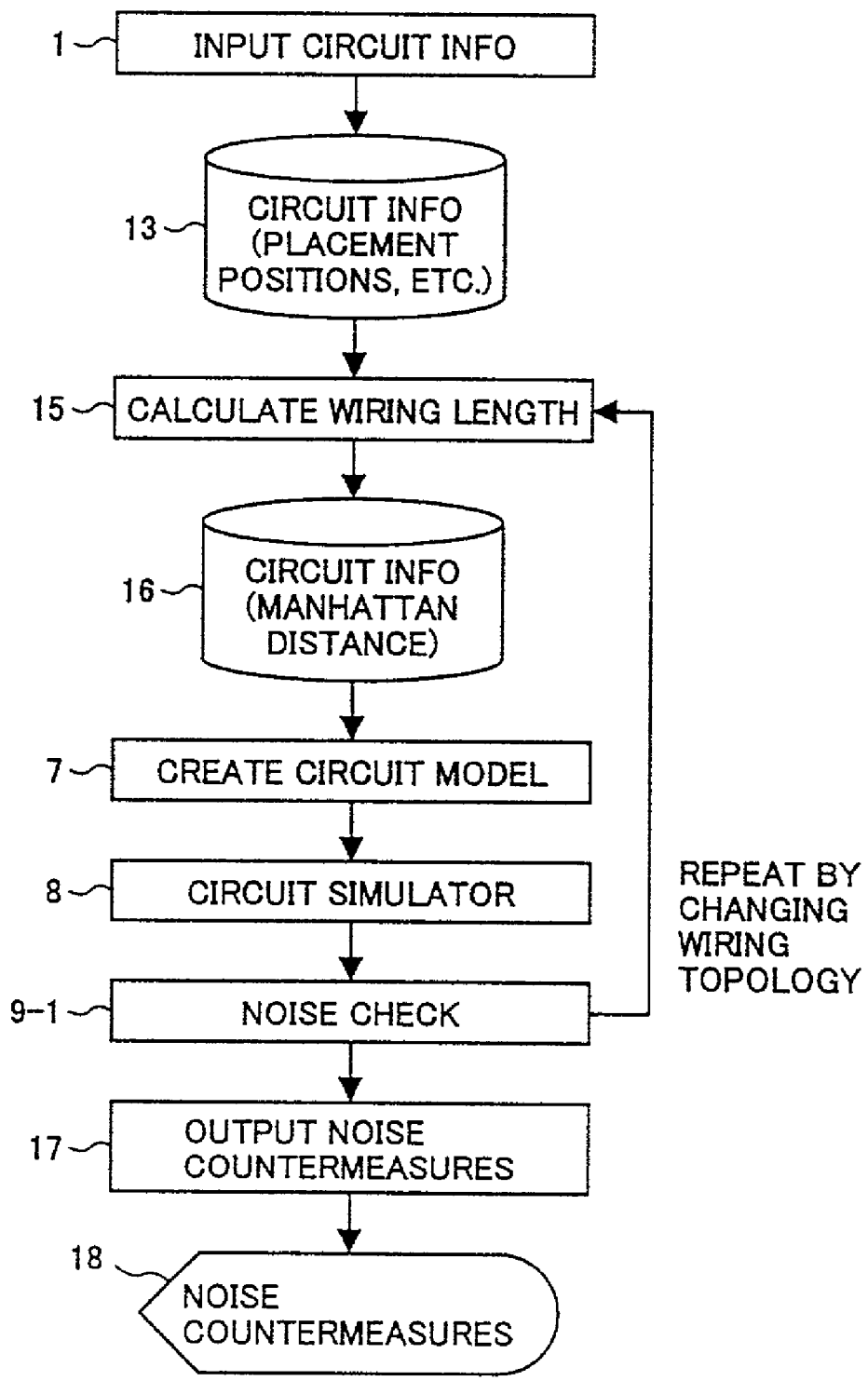
FIG. 10 is a flow chart for explaining a noise countermeasure determination process of the CPU in a fourth embodiment of the present invention.

FIG. 10 is a flow chart for explaining a noise countermeasure determination process of the CPU 201 of the computer system 100 which is applied with a fourth embodiment of the noise countermeasure determination method, a fourth embodiment of the noise countermeasure determination apparatus and a fourth embodiment of the computer-readable storage medium according to the present invention. In FIG. 10, those steps which are the same as those corresponding steps in FIG. 8 are designated by the same reference numerals, and a description thereof will be omitted. In this fourth embodiment, the wiring topology is not specified, and the processes up to the noise check are repeated using all selectable wiring topologies, so as to determine an optimum wiring topology from the results of the noise check.

In FIG. 10, the step 15 calculates, as the wiring length, the Manhattan distance based on the placement positions read from the memory part 202 as the input circuit information and a first wiring topology of the selectable wiring topologies. A step 9-1 carries out a noise check, and decides whether or not a selectable wiring topology remains. The process returns to the step 15 if the decision result in the step 9-1 is YES. Hence, the steps 15, 16, 7, 8 and 9-1 are repeated until no more selectable wiring topology remains and the decision result in the step 9-1 becomes NO. As a result, a step 17 obtains the optimum wiring topology as the noise countermeasures, based on the results of the repeated noise checks, and a step 18 outputs the optimum wiring topology which is obtained.

Figure 11:
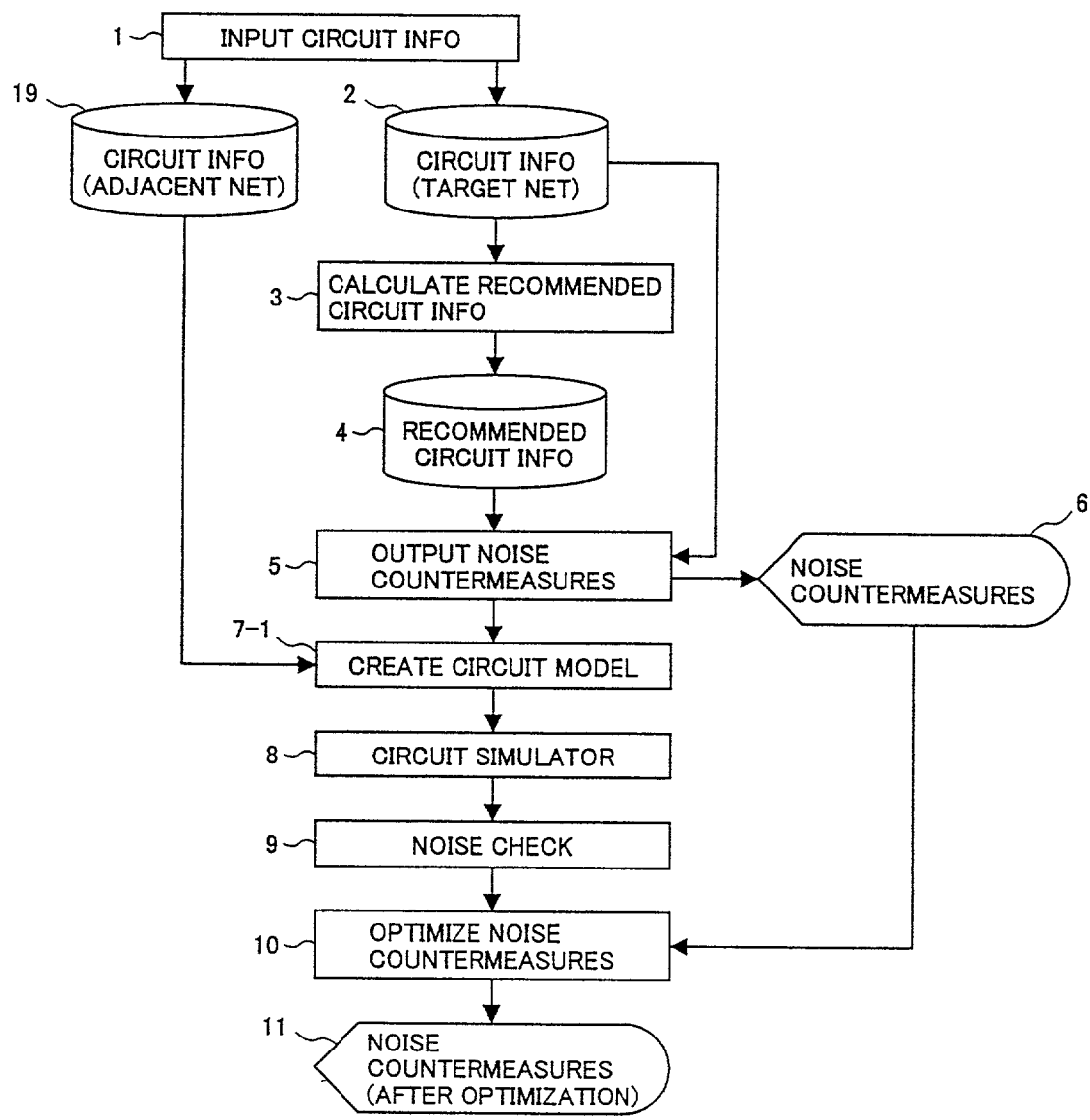
FIG. 11 is a flow chart for explaining a noise countermeasure determination process of the CPU in a fifth embodiment of the present invention.

FIG. 11 is a flow chart for explaining a noise countermeasure determination process of the CPU 201 of the computer system 100 which is applied with a fifth embodiment of the noise countermeasure determination method, a fifth embodiment of the noise countermeasure determination apparatus and a fifth embodiment of the computer-readable storage medium according to the present invention. In FIG. 11, those steps which are the same as those corresponding steps in FIG. 8 are designated by the same reference numerals, and a description thereof will be omitted. In this fifth embodiment, the noise check which is carried out takes into consideration a crosstalk noise.

In FIG. 11, of the input circuit information input by the step 1, circuit information related to a target net which is the target of the analysis is stored in a storage means such as the memory part 202 in the step 2, and the circuit information related to an adjacent net which is adjacent to the target net is stored in a storage means such as the memory part 202 in a step 19. A step 7-1 creates a simulation model of the target net and the adjacent net. Accordingly, the step 19 carries out a circuit simulation based on this simulation model, to calculate a propagation signal waveform and a crosstalk noise waveform of the target net, and to obtain a noise synthesized waveform by combining the propagation signal waveform and the crosstalk noise waveform. In addition, the step 9 carries out a noise check based on the noise synthesized waveform.

Figure 12:
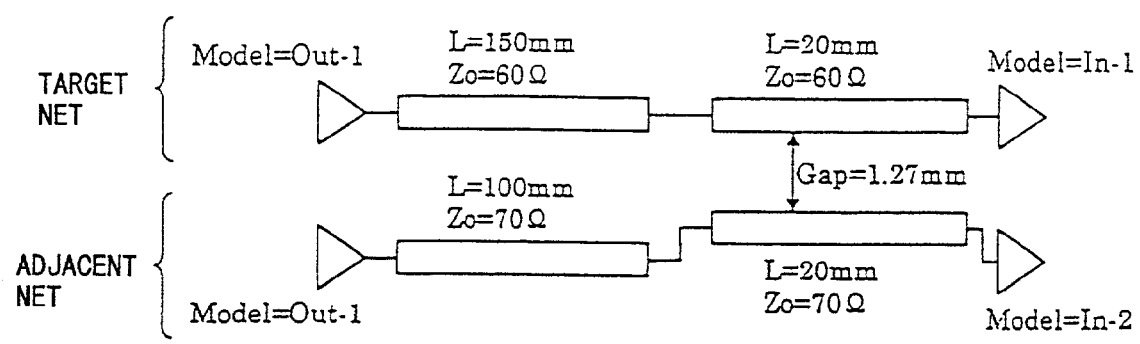
FIG. 12 is a diagram for explaining circuit information of a target net and an adjacent net.

FIG. 12 is a diagram for explaining circuit information of the target net and the adjacent net. As shown in FIG. 12, a crosstalk portion which should consider the crosstalk is specified within the net, and a pattern gap is input together with the circuit information. In this case, the circuit information of the target net includes a driver element, a wiring having a wiring length L=150 mm and an impedance Z0=60 Ohms, a wiring having a wiring length L=20 mm and an impedance Z0=60 Ohms, and a receiver element. The circuit information of the adjacent net includes a driver element, a wiring having a wiring length L=100 mm and an impedance Z0=70 Ohms, a wiring having a wiring length L=20 mm and an impedance Z0=70 Ohms, and a receiver element. In addition, a pattern gap Gap between the target and adjacent nets is Gap=1.27 mm. The step 8 creates a model of the crosstalk portion when creating the model of the circuit simulator, and obtains the noise synthesized waveform by combining the propagation signal waveform of the target net and the crosstalk noise waveform output from the circuit simulator. The noise check is carried out based on the noise synthesized waveform.

Figure 13:
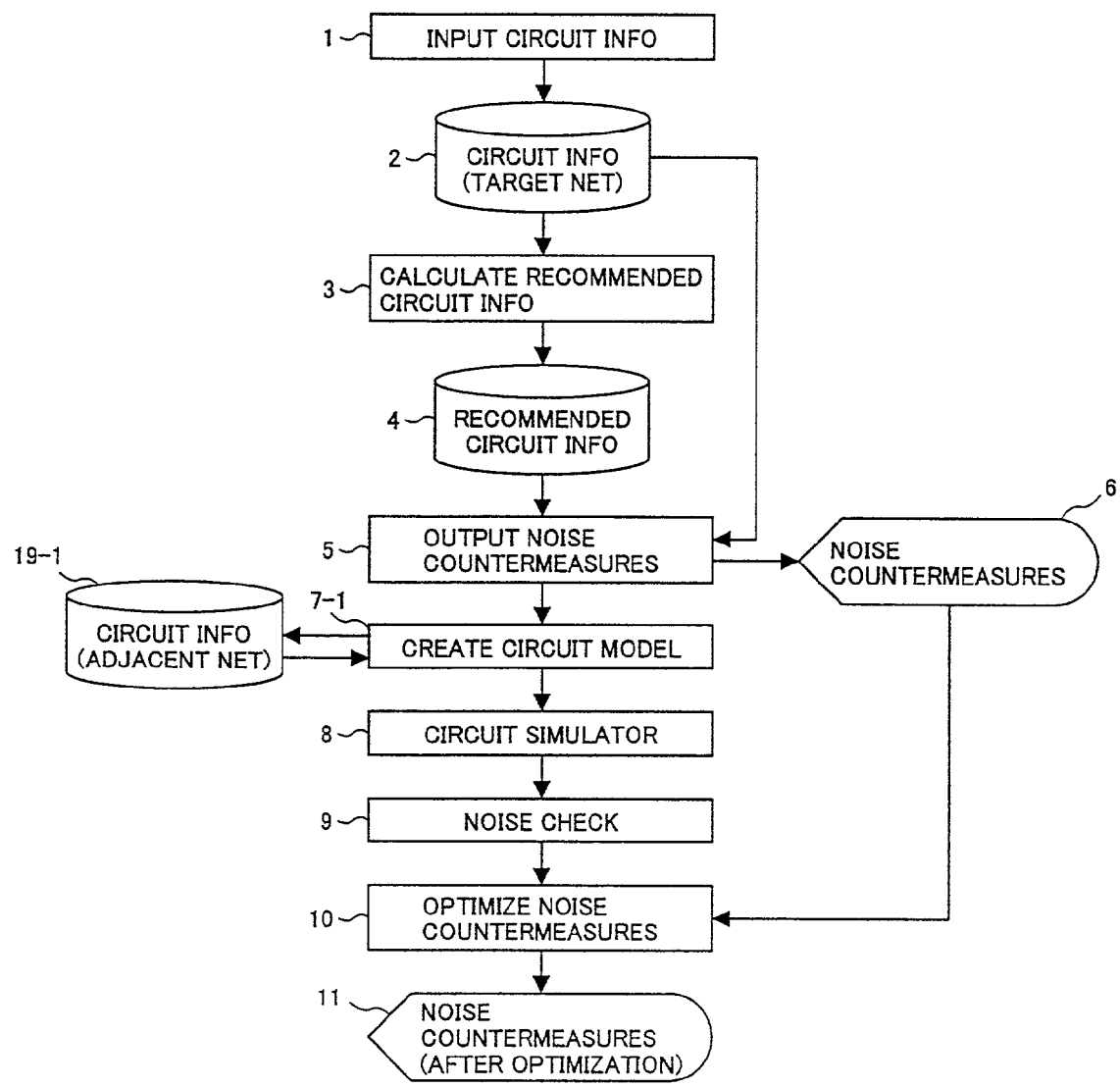
FIG. 13 is a flow chart for explaining a noise countermeasure determination process of the CPU in a sixth embodiment of the present invention.

FIG. 13 is a flow chart for explaining a noise countermeasure determination process of the CPU 201 of the computer system 100 which is applied with a sixth embodiment of the noise countermeasure determination method, a sixth embodiment of the noise countermeasure determination apparatus and a sixth embodiment of the computer-readable storage medium according to the present invention. In FIG. 13, those steps which are the same as those corresponding steps in FIG. 11 are designated by the same reference numerals, and a description thereof will be omitted. In this sixth embodiment, instead of inputting the circuit information of the adjacent net, a simulation model is created by assuming that a net having the same structure as the target net is adjacent to the target net with a constant pattern gap formed therebetween.

In FIG. 13, a step 19-1 stores the circuit information related to the target net, as the circuit information related to the adjacent net which is adjacent to the target net, in a storage means such as the memory part 202. In other words, the circuit information of the adjacent net is automatically generated by assuming that the net having the same structure as the target net is adjacent to the target net with the constant pattern gap formed therebetween. The step 7-1 creates the simulation models of the target net and the adjacent net using the circuit information of the adjacent net.

Figure 14:
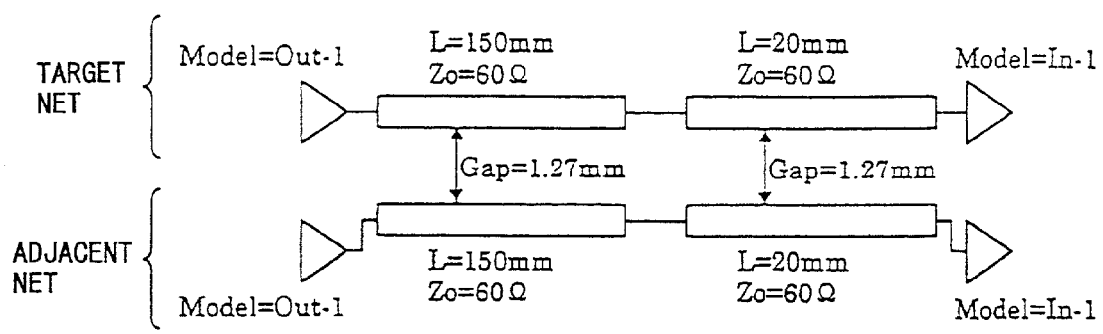
FIG. 14 is a diagram for explaining circuit information of a target net and an adjacent net.

FIG. 14 is a diagram for explaining the circuit information of the target net and the adjacent net. As shown in FIG. 14, a crosstalk portion which should consider the crosstalk is specified within the net, and the circuit information of the adjacent net is automatically generated by assuming that the net having the same structure as the target net is adjacent to the target net with the constant pattern gap formed therebetween. In this case, the circuit information of the target net includes a driver element, a wiring having a wiring length L=150 mm and an impedance Z0=60 Ohms, a wiring having a wiring length L=20 mm and an impedance Z0=60 Ohms, and a receiver element. The circuit information of the adjacent net, which is automatically generated, includes a driver element, a wiring having a wiring length L=150 mm and an impedance Z0=60 Ohms, a wiring having a wiring length L=20 mm and an impedance Z0=60 Ohms, and a receiver element. In addition, a pattern gap Gap between the target and adjacent nets is Gap=1.27 mm. The step 8 creates a model of the crosstalk portion when creating the model of the circuit simulator, and obtains the noise synthesized waveform by combining the propagation signal waveform of the target net and the crosstalk noise waveform output from the circuit simulator. The noise check is carried out based on the noise synthesized waveform.

Figure 15:
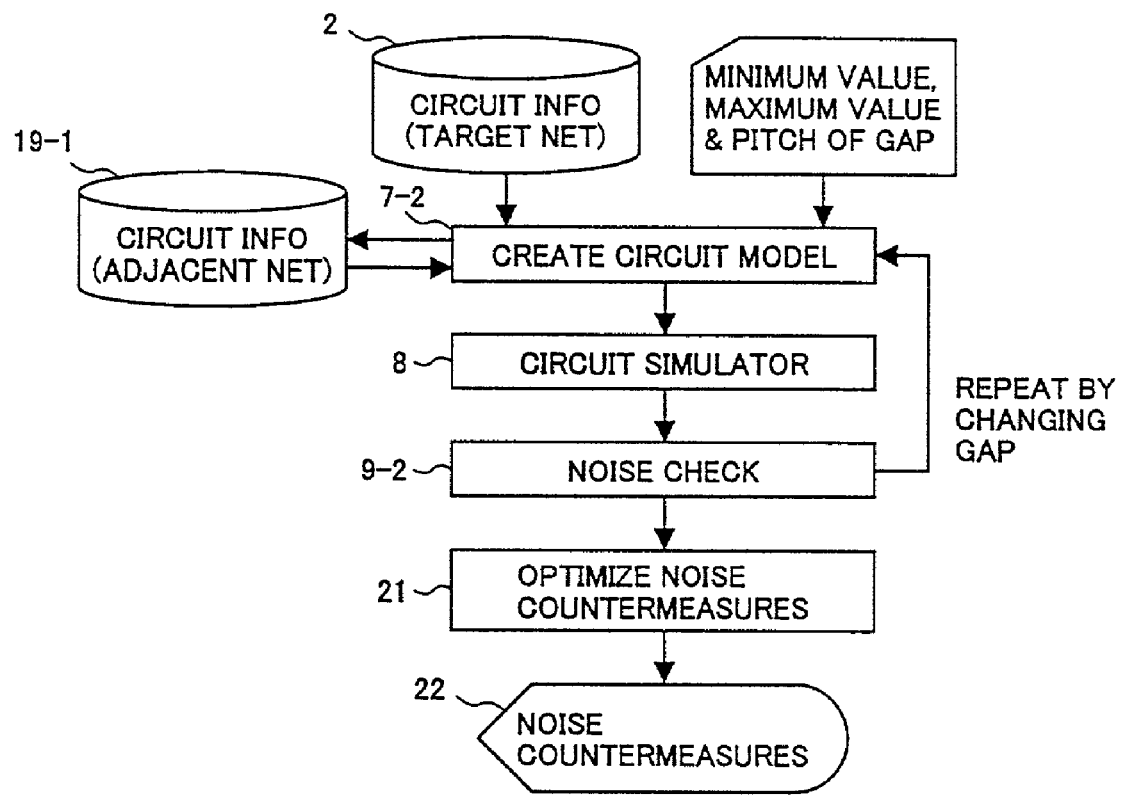
FIG. 15 is a flow chart for explaining a noise countermeasure determination process of the CPU in a seventh embodiment of the present invention.

FIG. 15 is a flow chart for explaining a noise countermeasure determination process of the CPU 201 of the computer system 100 which is applied with a seventh embodiment of the noise countermeasure determination method, a seventh embodiment of the noise countermeasure determination apparatus and a seventh embodiment of the computer-readable storage medium according to the present invention. In FIG. 15, those steps which are the same as those corresponding steps in FIG. 13 are designated by the same reference numerals, and a description thereof will be omitted. In this seventh embodiment, the processes from the creation of the simulation model up to the noise check are repeated while changing the pattern gap between the target net and the adjacent net, so as to obtain and output as the noise countermeasures a minimum pattern gap which makes the noise fall within the tolerable range.

In FIG. 15, a step 7-2 creates a simulation model based on a maximum value, a minimum value and a pitch of the pattern gap between the target net and the adjacent net, in addition to the circuit information of the target net and the circuit information of the adjacent net. Further, a step 9-2 creates the circuit information of the adjacent net using the minimum value of the pattern gap, and carries out a noise check by taking the crosstalk into consideration. If the noise exceeds a tolerable range as a result of the noise check, the pattern gap is increased by an amount corresponding to the pitch, and the process returns to the step 7-2. Therefore, the steps 7-2, 8 and 9-2 are repeated until the noise falls within the tolerable range. Then, a step 21 obtains, as the noise countermeasures, a minimum pattern gap which makes the noise fall within the tolerable range. In addition, a step 22 outputs the noise countermeasures which are obtained.

The processes of each of the embodiments described above may be carried out based on data of the circuit design or, data of the layout design. Moreover, by executing all selectable combinations, similarly to the noise measure determination method which outputs the wiring topology as the noise countermeasures, optimum resistance, branching length, characteristic impedance of the wiring, wiring pattern width and the like may be output as the noise countermeasures.

Next, a description will be given of the recommended circuit information and the noise countermeasures which are obtained with respect to particular input circuit information. In the following description, it is assumed for the sake of convenience that the recommended circuit information and the noise countermeasures are obtained by the third embodiment shown in FIG. 8.

Figure 16:
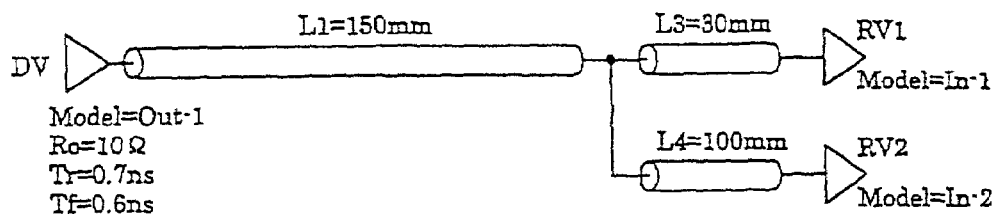
FIG. 16 is a diagram showing input circuit information.

FIG. 16 is a diagram showing particular input circuit information. In this case, the wiring topology is the load concentration type, and a characteristic impedance Z0 of the wiring pattern is Z0=60 Ohms, and a transmission delay time Td of the wiring pattern is Td=7.0 ns/m. The input circuit information includes a driver element DV having an output resistance R0 of R0=10 Ohms, a rising time Tr of Tr=0.7 ns and a falling rime Tf of Tf=0.6 ns, a wiring having a wiring length L1 of L1=150 mm, a wiring having a wiring length L3 of L3=30 mm, a wiring having a wiring length L4 of L4=100 mm, a receiver element RV1 and a receiver element RV2.

Figure 17:
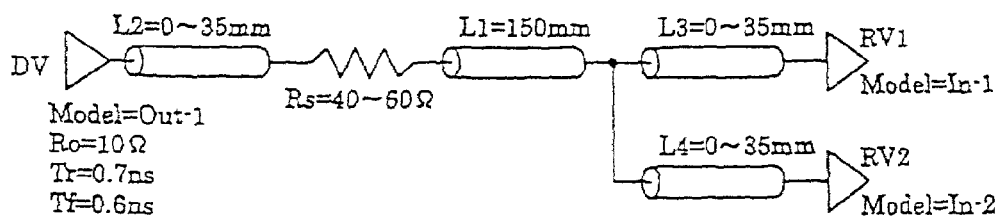
FIG. 17 is a diagram showing recommended circuit information with respect to the input circuit information shown in FIG. 16.

FIG. 17 is a diagram showing recommended circuit information which is obtained with respect to the input circuit information shown in FIG. 16. In the case of the recommended circuit information shown in FIG. 17, the wiring topology is the load concentration type, and a characteristic impedance Z0 of the wiring pattern is Z0=60 Ohms, and a transmission delay time Td of the wiring pattern is Td=7.0 ns/m. The recommended circuit information includes a driver element DV having an output resistance R0 of R0=10 Ohms, a rising time Tr of Tr=0.7 ns and a falling rime Tf of Tf=0.6 ns, a wiring having a wiring length L2 of L2=0 to 35 mm, a damping resistor having a damping resistance Rs of Rs=40 to 60 Ohms, a wiring having a wiring length L1 of L1=150 mm, a wiring having a wiring length L3 of L3=0 to 35 mm, a wiring having a wiring length L4 of L4=0 to 35 mm, a receiver element RV1 and a receiver element RV2.

In this case, the recommended value of 40 Ohms$\leq$Rs$\leq$60 Ohms for the damping resistor is calculated from the characteristic impedance Z0 of the wiring and the output resistance R0 of the driver element DV. The recommended value of 0$\leq$L2$\leq$35 mm for the wiring length L2 between the driver element DV and the damping resistor is calculated from the transmission delay time Td of the wiring pattern and the rising time Tr and the falling time Tf of the driver element DV. The recommended value of 0$\leq$L3$\leq$35 mm for the wiring length L2 between the branching point and the receiver element RV1 is calculated from the transmission delay time Td of the wiring pattern and the rising time Tr and the falling time Tf of the driver element DV. The recommended value of 0$\leq$L4$\leq$35 mm for the wiring length L4 between the branching point and the receiver element RV2 is calculated from the transmission delay time Td of the wiring pattern and the rising time Tr and the falling time Tf of the driver element DV.

The noise countermeasures are determined based on differences between the input circuit information shown in FIG. 16 and the recommended circuit information shown in FIG. 17. For example, the noise countermeasures determined in this case include adding a damping resistor Rs having a resistance of 40 to 60 Ohms at a position which is 0 to 35 mm from the driver element DV, and changing the wiring length L4 between the branching point and the receiver element RV2 to 0 to 35 mm.

Figure 18:
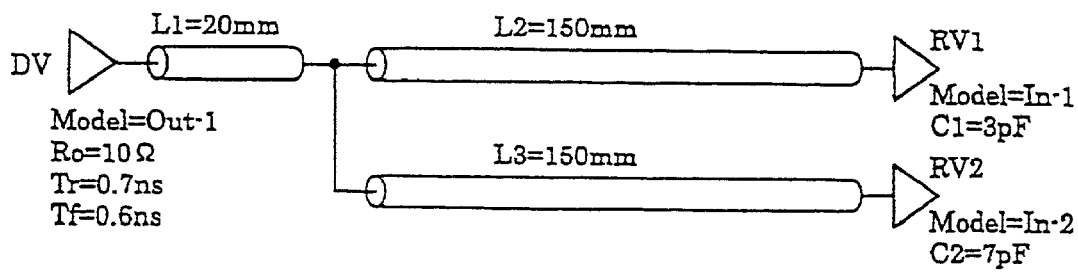
FIG. 18 is a diagram showing input circuit information.

FIG. 18 is a diagram showing another particular input circuit information. In this case, the wiring topology is the star type, and a characteristic impedance Z0 of the wiring pattern is Z0=60 Ohms, and a transmission delay time Td of the wiring pattern is Td=7.0 ns/m. The input circuit information includes a driver element DV having an output resistance R0 of R0=10 Ohms, a rising time Tr of Tr=0.7 ns and a falling rime Tf of Tf=0.6 ns, a wiring having a wiring length L1 of L1=20 mm, a wiring having a wiring length L2 of L2=150 mm, a wiring having a wiring length L3 of L3=150 mm, a receiver element RV1 having a load capacitance C1 of C1=3 pF, and a receiver element RV2 having a load capacitance C2 of C2=7 pF.

Figure 19:
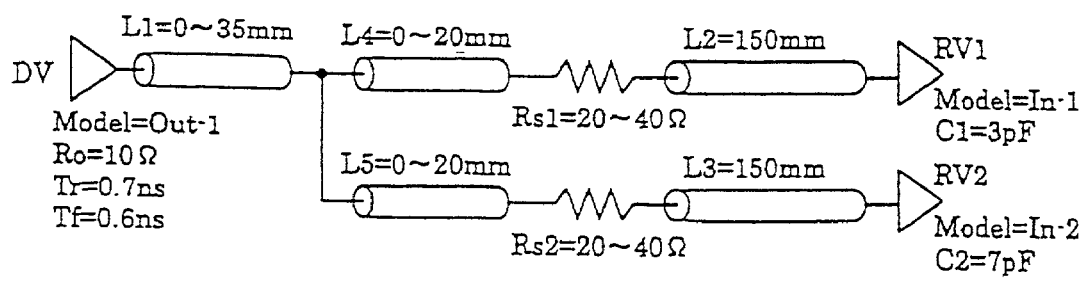
FIG. 19 is a diagram for explaining recommended circuit information with respect to the input circuit information shown in FIG. 18.

FIG. 19 is a diagram showing recommended circuit information which is obtained with respect to the input circuit information shown in FIG. 18. In the case of the recommended circuit information shown in FIG. 17, the wiring topology is the load concentration type, and a characteristic impedance Z0 of the wiring pattern is Z0=60 Ohms, and a transmission delay time Td of the wiring pattern is Td=7.0 ns/m. The recommended circuit information includes a driver element DV having an output resistance R0 of R0=10 Ohms, a rising time Tr of Tr=0.7 ns and a falling rime Tf of Tf=0.6 ns, a wiring having a wiring length L1 of L1=0 to 35 mm, a wiring having a wiring length L4 of L4=0 to 20 mm, a wiring having a wiring length L5 of L5=0 to 20 mm, a damping resistor having a damping resistance Rs1 of Rs1=20 to 40 Ohms, a damping resistor having a damping resistance Rs2 of Rs2=20 to 40 Ohms, a wiring having a wiring length L2 of L2=150 mm, a wiring having a wiring length L3 of L3=150 mm, a receiver element RV1 having a load capacitance C1 of C1=3 pF, and a receiver element RV2 having a load capacitance C2 of C2=7 pF.

In this case, the recommended value (maximum value) of Rs1≦40 Ohms of the first damping resistor and the recommended value (maximum value) of Rs2≦40 Ohms for the second damping resistor are calculated from the characteristic impedance Z0 of the wiring and the output resistance R0 of the driver element DV. In addition, the recommended value (minimum value) of 20 Ohms≦Rs1 of the first damping resistor and the recommended value (minimum value) of 20 Ohms≦Rs2 for the second damping resistor are calculated from the load capacitance C1 of the receiver element RV1 and the load capacitance C2 of the receiver element RV2. The recommended value of 0≦L1≦35 mm for the wiring length L1 between the driver element DV and the branching point is calculated from the transmission delay time Td of the wiring pattern and the rising time Tr and the falling time Tf of the driver element DV. The recommended value of 0≦L4≦20 mm for the wiring length L4 between the branching point and the first damping resistor (Rs1) is calculated from the transmission delay time Td of the wiring pattern and the rising time Tr and the falling time Tf of the driver element DV. The recommended value of 0≦L5≦20 mm for the wiring length L5 between the branching point and the second damping resistor (Rs2) is calculated from the transmission delay time Td of the wiring pattern and the rising time Tr and the falling time Tf of the driver element DV.

The noise countermeasures are determined based on differences between the input circuit information shown in FIG. 18 and the recommended circuit information shown in FIG. 19. For example, the noise countermeasures determined in this case include adding a damping resistor Rs1 having a resistance of 20 to 40 Ohms at a position which is between the branching point and the receiver element RV1 and is 0 to 35 mm from the branching point, and adding a damping resistor Rs2 having a resistance of 20 to 40 Ohms at a position which is between the branching point and the receiver element RV2 and is 0 to 35 mm from the branching point.

Figure 20:
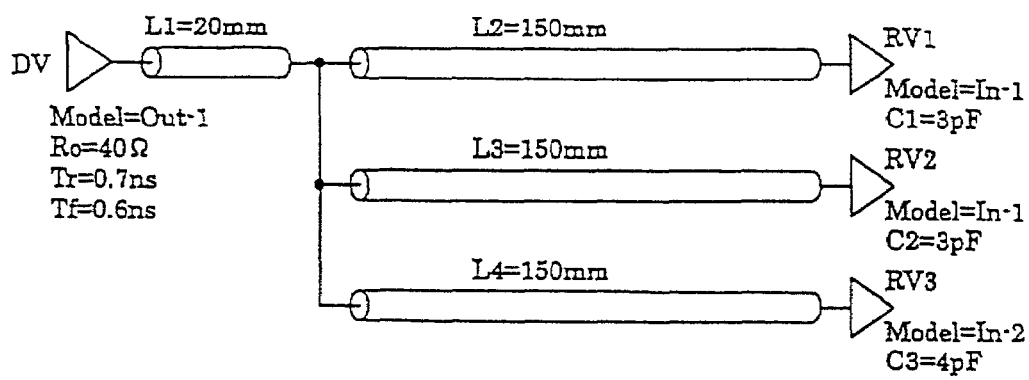
FIG. 20 is a diagram showing input circuit information.

FIG. 20 is a diagram showing still another particular input circuit information. In this case, the wiring topology is the star type, and a characteristic impedance Z0 of the wiring pattern is Z0=60 Ohms, and a transmission delay time Td of the wiring pattern is Td=7.0 ns/m. The input circuit information includes a driver element DV having an output resistance R0 of R0=40 Ohms, a rising time Tr of Tr=0.7 ns and a falling rime Tf of Tf=0.6 ns, a wiring having a wiring length L1 of L1=20 mm, a wiring having a wiring length L2 of L2=150 mm, a wiring having a wiring length L3 of L3=150 mm, a wiring having a wiring length L4 of L4=150 mm, a receiver element RV1 having a load capacitance C1 of C1=3 pF, a receiver element RV2 having a load capacitance C2 of C2=3 pF, and a receiver element RV3 having a load capacitance C3 of C3=4 pF.

Figure 21:
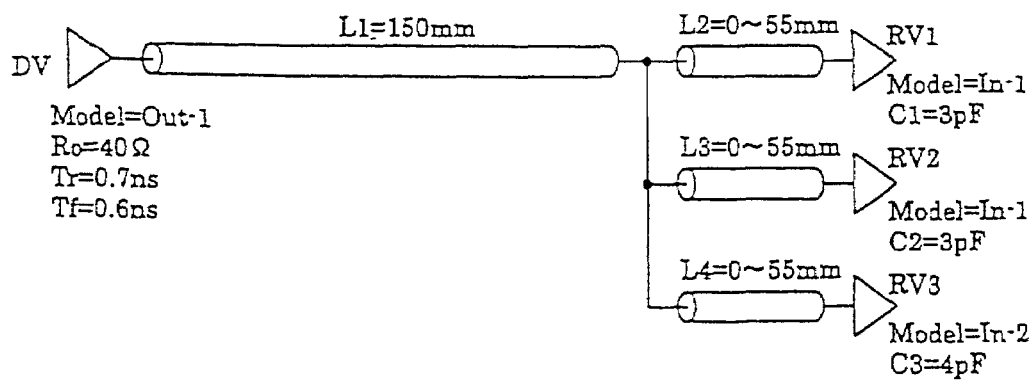
FIG. 21 is a diagram for explaining recommended circuit information with respect to the input circuit information shown in FIG. 20.

FIG. 21 is a diagram showing recommended circuit information which is obtained with respect to the input circuit information shown in FIG. 20. In the case of the recommended circuit information shown in FIG. 21, the wiring topology is the load concentration type, and a characteristic impedance Z0 of the wiring pattern is Z0=60 Ohms, and a transmission delay time Td of the wiring pattern is Td=7.0 ns/m. The recommended circuit information includes a driver element DV having an output resistance R0 of R0=40 Ohms, a rising time Tr of Tr=0.7 ns and a falling rime Tf of Tf=0.6 ns, a wiring having a wiring length L1 of L1=0 to 150 mm, a wiring having a wiring length L2 of L2=0 to 55 mm, a wiring having a wiring length L3 of L3=0 to 55 mm, a wiring having a wiring length L4 of L4=0 to 55 mm, a receiver element RV1 having a load capacitance C1 of C1=3 pF, a receiver element RV2 having a load capacitance C2 of C2=3 pF, and a receiver element RV3 having a load capacitance C3 of C3=4 pF.

In this case, the load concentration type is selected for the wiring topology, based on the characteristic impedance Z0 of the wiring which is Z0=60 Ohms, the output resistance R0 of the driver element DV which is D0=40 Ohms, the number of receiver elements which is three in this case, and the load capacitances C1, C2 and C3 of the receiver elements RV1, RV2 and RV3 which are C1=C2=3 pF and C3=4 pF. The recommended value of L1=150 mm for the wiring length L1 between the driver element DV and the branching point is calculated from the wiring topology and the wiring lengths L1, L2 and L3 which are L1=20 mm, L2=150 mm and L3=150 mm. The recommended value of 0≦L2≦55 mm for the wiring length L2 between the branching point and the receiver element RV1 is calculated from the transmission delay time Td of the wiring pattern and the rising time Tr and the falling time Tf of the driver element DV. The recommended value of 0≦L3≦55 mm for the wiring length L3 between the branching point and the receiver element RV2 is calculated from the transmission delay time Td of the wiring pattern and the rising time Tr and the falling time Tf of the driver element DV. The recommended value of 0≦L4≦55 mm for the wiring length L4 between the branching point and the receiver element RV3 is calculated from the transmission delay time Td of the wiring pattern and the rising time Tr and the falling time Tf of the driver element DV.

The noise countermeasures are determined based on differences between the input circuit information shown in FIG. 20 and the recommended circuit information shown in FIG. 21. For example, the noise countermeasures determined in this case include changing the wiring topology to the load concentration type, changing the wiring length L1 between the driver element DV and the branching point to L1=150 mm, changing the wiring length L2 between the branching point and the receiver element RV1 to L2=0 to 55 mm, changing the wiring length L3 between the branching point and the receiver element RV2 to L3=0 to 55 mm, and changing the wiring length L4 between the branching point and the receiver element RV3 to L4=0 to 55 mm.

Of course, the recommended circuit information is not limited to the information described above in conjunction with each of the embodiments. For example, the recommended circuit information may include a wiring length between a driver element and a damping resistor, wiring lengths between a branching point and each of the receiver elements, differences between the wiring lengths between the driver element and each of the receiver elements, a resistance of the damping resistor, an inserting position of the damping resistor, a resistance of a pull-up resistor, a resistance of a pull-down resistor, a pull-up voltage, a driven ability of the driver element, a number of loads such as the number of receiver elements provided with respect to one driver element, a wiring topology and the like.

Figure 22:
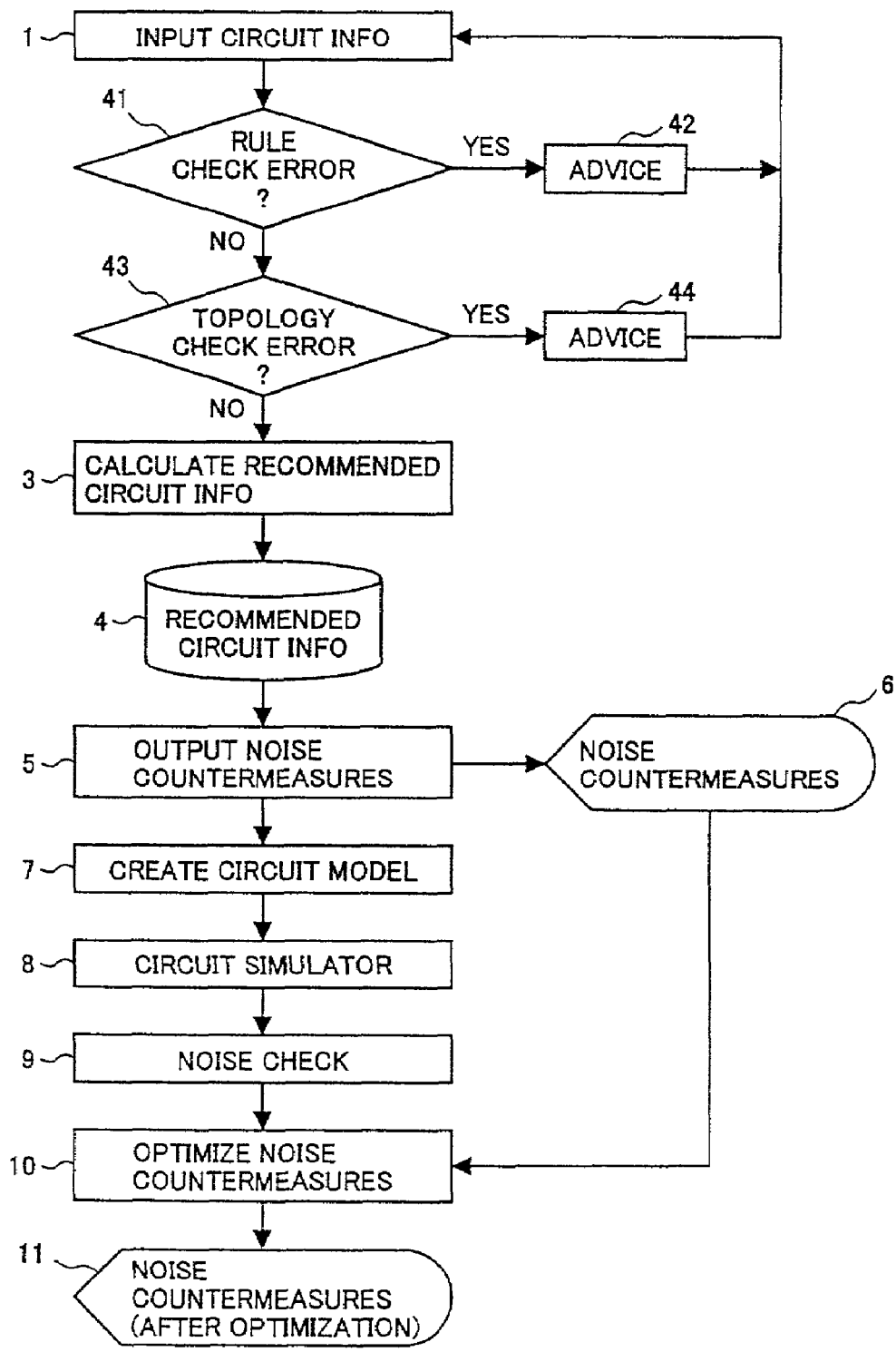
FIG. 22 is a flow chart for explaining a noise countermeasure determination process of the CPU in an eighth embodiment of the present invention.

FIG. 22 is a flow chart for explaining a noise countermeasure determination process of the CPU 201 of the computer system 100 which is applied with an eighth embodiment of the noise countermeasure determination method, an eighth embodiment of the noise countermeasure determination apparatus and an eighth embodiment of the computer-readable storage medium according to the present invention. In FIG. 22, those steps which are the same as those corresponding steps in FIG. 4 are designated by the same reference numerals, and a description thereof will be omitted. In this eighth embodiment, a rule check and a topology check are carried out with respect to the input circuit information. When an error is found during the rule check or the topology check, an advice for correcting the error is displayed, so as to reduce the time required to make the circuit correction and to improve the accuracy of the advice.

In FIG. 22, a step 41 carries out a rule check of the circuit (hereinafter simply referred to as a circuit rule check) with respect to the input circuit information, and decides whether or not a rule error is found. The circuit rule check includes checking a disconnection and a loop (short-circuit) of the wiring, checking the existence of an antenna wiring, and checking the logic such as whether or not the circuit consists only of a driver element or only of a receiver element, and whether or not no pull-up resistor is provided in an open-drain circuit. In other words, the circuit rule check makes common and basic checks of the circuit. As a result, it is possible to find the rule error of the input circuit information at an early stage of the noise countermeasure determination process. If the decision result in the step 41 is YES, a step 42 displays on the display 102 an advice indicating how the input circuit information should be corrected with respect to the rule error which is found. After the step 42, the process returns to the step 1, and the operator corrects the input circuit information so as to eliminate the rule error according to the advice.

On the other hand, if the decision result in the step 41 is NO, a step 43 carries out a topology check of the wiring (hereinafter simply referred to as a wiring topology check) with respect to the input circuit information, and decides whether or not a topology error is found. The wiring topology categorizes the wirings of the circuit into how the wirings are connected. The wiring topology includes the load concentration type including the 1:1 type, the star type, and the daisy chain type. For example, it is possible to obtain good characteristics such as good signal waveforms by employing one of such connection types for the wirings of the circuit. For this reason, by making a check to determine the wiring topology employed by the circuit and finding an erroneous portion which does not conform to the connection type, it is possible to find a topology error of the input circuit information at an early stage of the noise countermeasure determination process. If the decision result in the step 43 is YES, a step 44 displays on the display 102 an advice indicating how the input circuit information should be corrected with respect to the topology error which is found. After the step 44, the process returns to the step 1, and the operator corrects the input circuit information so as to eliminate the topology error according to the advice.

If the decision result in the step 43 is NO, the process advances to the step 3. In other words, when no error is found as a result of the circuit rule check and the wiring topology check which are made with respect to the input circuit information, the recommended circuit information is calculated as in the case of the second embodiment described above based on the checked input circuit information.

Of course, the order in which the steps 41 and 43 are carried out may be reversed. That is, it is possible to carry out the circuit rule check in the step 41 when no topology error exists as a result of the wiring topology check which is carried out in the step 43, and to advance the process to the step 3 when no rule error exists as a result of the circuit rule check.

Therefore, according to this embodiment, it is possible to find the rule error and the topology error at an early stage of the noise countermeasure determination process, as compared to the case where the input circuit information is corrected based on the result of the noise check which is carried out by the waveform analysis or the like in the step 9, for example. In addition, because the advice is displayed when one of the rule error and the topology error is found, it is possible to reduce the time required to correct the circuit and to improve the accuracy of the advice.

Figure 23:
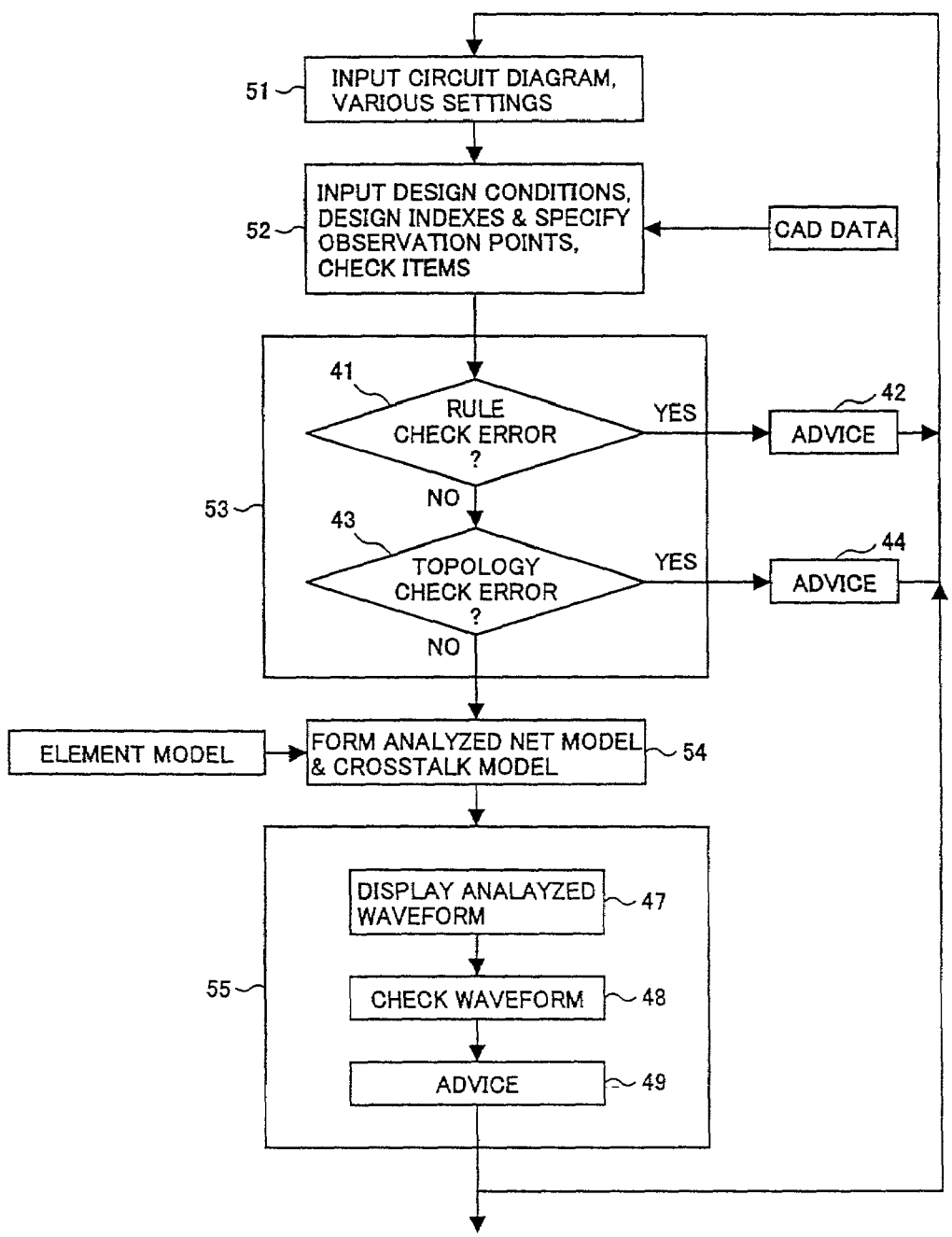
FIG. 23 is a flow chart for explaining a noise countermeasure determination process of the CPU in a ninth embodiment of the present invention.

FIG. 23 is a flow chart for explaining a noise countermeasure determination process of the CPU 201 of the computer system 100 which is applied with a ninth embodiment of the noise countermeasure determination method, a ninth embodiment of the noise countermeasure determination apparatus and a ninth embodiment of the computer-readable storage medium according to the present invention. In FIG. 23, those steps which are the same as those corresponding steps in FIG. 22 are designated by the same reference numerals, and a description thereof will be omitted. In this ninth embodiment, a rule check and a topology check are carried out with respect to the input circuit information. When an error is found during the rule check or the topology check, an advice for correcting the error is displayed, so as to reduce the time required to make the circuit correction and to improve the accuracy of the advice.

In FIG. 23, a step 51 inputs a circuit diagram and various settings. A step 52 inputs design conditions, inputs design indexes, specifies observation points, and specifies check items and the like. The information input or specified in the step 52 may be made based on CAD data. The steps 51 and 52 correspond to the step 1 shown in FIG. 22, and input the input circuit information.

A step 53 includes the steps 41 and 42, and also carries out a portion of the step 3 shown in FIG. 4. Accordingly, the results of the circuit rule check and the wiring topology check with respect to the input circuit information are obtained by the step 53.

A step 54 forms an analyzed net model and a crosstalk model of the input circuit information, based on the results obtained from the step 53, and creates a circuit model therefrom. This step 54 corresponds to the step 7 shown in FIG. 4.

A step 55 includes steps 47, 48 and 49. The step 47 analyzes the created circuit model using a circuit simulator. This step 47 corresponds to the step 8 shown in FIG. 4. The step 48 checks whether or not a noise which will cause a problem, that is, a noise which exceeds a tolerable range, is generated, based on the analysis results of the circuit simulator. Such a noise check may be made based on a signal waveform propagating through a wiring of the electronic circuit and output from the circuit simulator, by detecting a noise existing in the signal waveform. In addition, the step 48 may check the signal waveform analyzed in the step 47, so as to detect a portion which does not conform to the design conditions or an abnormal portion (erroneous portion) in the signal waveform. The step 48 corresponds to the step 9 shown in FIG. 4.

The step 49 categorizes the results of the noise check and optimizes the noise countermeasures, displays the optimized noise countermeasures on the display 102, and displays an advice on the display 102. The step 49 corresponds to the steps 10 and 11 shown in FIG. 4. Accordingly, based on information such as the degree of mismatch of the signal waveform and the design conditions, the kind of abnormality existing in the signal waveform and the voltage and time of the abnormality, the step 49 outputs, as the advice, the analysis results using an advice tree structure. Since an optimum solution for improving the abnormality of the signal waveform is prepared at a tip end of each branch of the advice tree structure, the optimum solutions with respect to the various abnormalities, including the noise, are automatically output as the advice. After the step 49, the process returns to the step 51, and the operator corrects the circuit depending on the advice which is output with respect to the abnormality.

Next, a description will be given of the judging contents of the rule check made in the step 41 and a corresponding advice made in the step 42. Of course, the judging contents and the corresponding advice are not limited to those described hereinafter. The advice corresponding to the judging contents is stored in the memory part 202, for example.

If the judging contents are "no floating element or pattern which is not connected to a target driver element exists", for example, the corresponding advice output in the step 42 for the case where the decision result in the step 41 is YES is "delete floating element or pattern". If the judging contents are "no loop pattern exists", the corresponding advice output in the step 42 for the case where the decision result in the step 41 is YES is "delete loop". If the judging contents are "no antenna pattern exists", the corresponding advice output in the step 42 for the case where the decision result in the step 41 is YES is "delete antenna". If the judging contents are "net is not directly connected to a power source or ground", the corresponding advice output in the step 42 for the case where the decision result in the step 41 is YES is "delete power source or ground directly connected to the net". If the judging contents are "one or more receiver elements exist", the corresponding advice output in the step 42 for the case where the decision result in the step 41 is YES is "add receiver element". If the judging contents are "one or more elements capable of becoming a driver element exist", the corresponding advice output in the step 42 for the case where the decision result in the step 41 is YES is "add a driver element". Furthermore, if the judging contents are "check number of loads: the recommended number of loads should be satisfied", the corresponding advice output in the step 42 for the case where the decision result in the step 41 is YES is "change to a driver element having a larger driven ability or, reduce the number of loads to a number smaller than the recommended number of loads".

Next, a description will be given of the judging contents of the topology check made in the step 43 and the corresponding advice made in the step 44. Of course, the judging contents and the corresponding advice are not limited to those described hereinafter. The advice corresponding to the judging contents is stored in the memory part 202, for example.

FIG. 24 is a diagram showing a load concentration type wiring topology for a unidirectional transmission. In the case of such a load concentration type wiring topology, if the judging contents are "the number of resistors connected in series is one or less in the case of a 1:1 type unidirectional transmission", the corresponding advice output in the step 44 for the case where the decision result in the step 43 is YES is "a damping resistor is redundant if an excess resistor is connected in series, and thus, maintain the resistor connected in series closest to a driver element and delete other resistors". In addition, if the judging contents are "the number of resistors connected in series between a target driver element and a first branching point is one or less in the case of a 1:1 type unidirectional transmission", the corresponding advice which is output in the step 44 in the case where the decision result in the step 43 is YES is "a damping resistor is redundant if an excess resistor is connected in series, and thus, maintain the resistor connected in series closest to a driver element and delete other resistors".

FIGS. 25A and 25B respectively are diagrams showing a star type wiring topology for the unidirectional transmission. Both FIGS. 25A and 25B show the star type wiring topologies. In the case of the star type wiring topologies such as those shown in FIGS. 25A and 25B, if the judging contents are "the number of damping resistors after each branching point is one or less", the corresponding advice output in the step 44 for the case where the decision result in the step 43 is YES is "match the number of damping resistors to one if two or more damping resistors exist after the branching point".

Figure 26A:
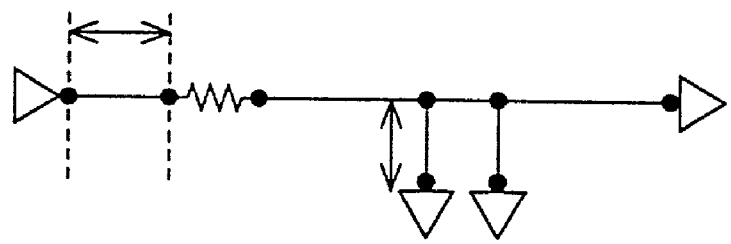
FIGS. 26A and 26B respectively are diagrams showing a daisy chain type wiring topology for the unidirectional transmission.
Figure 26B:
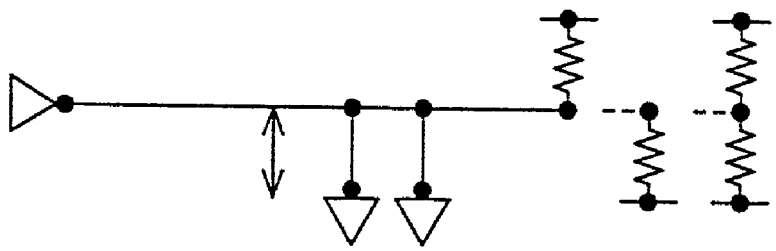

FIGS. 26A and 26B respectively are diagrams showing a daisy chain type wiring topology for the unidirectional transmission. Both FIGS. 26A and 26B show the daisy chain type wiring topologies. In the case of the daisy chain type wiring topology such as that shown in FIG. 26A, if the judging contents are "the number of damping resistors between a target driver element and a first branching point is one or less", the corresponding advice output in the step 44 for the case where the decision result in the step 43 is YES is "a damping resistor is redundant if an excess resistor is connected in series, and thus, maintain the resistor connected in series closest to a driver element and delete other resistors". In addition, in the case of the daisy chain type wiring topology such as that shown in FIG. 26B, if the judging contents are "a length of a wiring branching from a main wiring satisfies a predetermined formula", the corresponding advice output in the step 44 for the case where the decision result in the step 43 is YES is "make the length of the wiring less than or equal to a predetermined length if the judging contents are not satisfied".

According to the eighth and ninth embodiments described above, the check is carried out in steps with respect to the input circuit information, and an appropriate advice is output when an error is found. For this reason, it is possible to find the error at an early stage of the noise countermeasure determination process and urge the operator to correct the circuit, thereby efficiently reducing the time required to correct the circuit.

Figure 27:
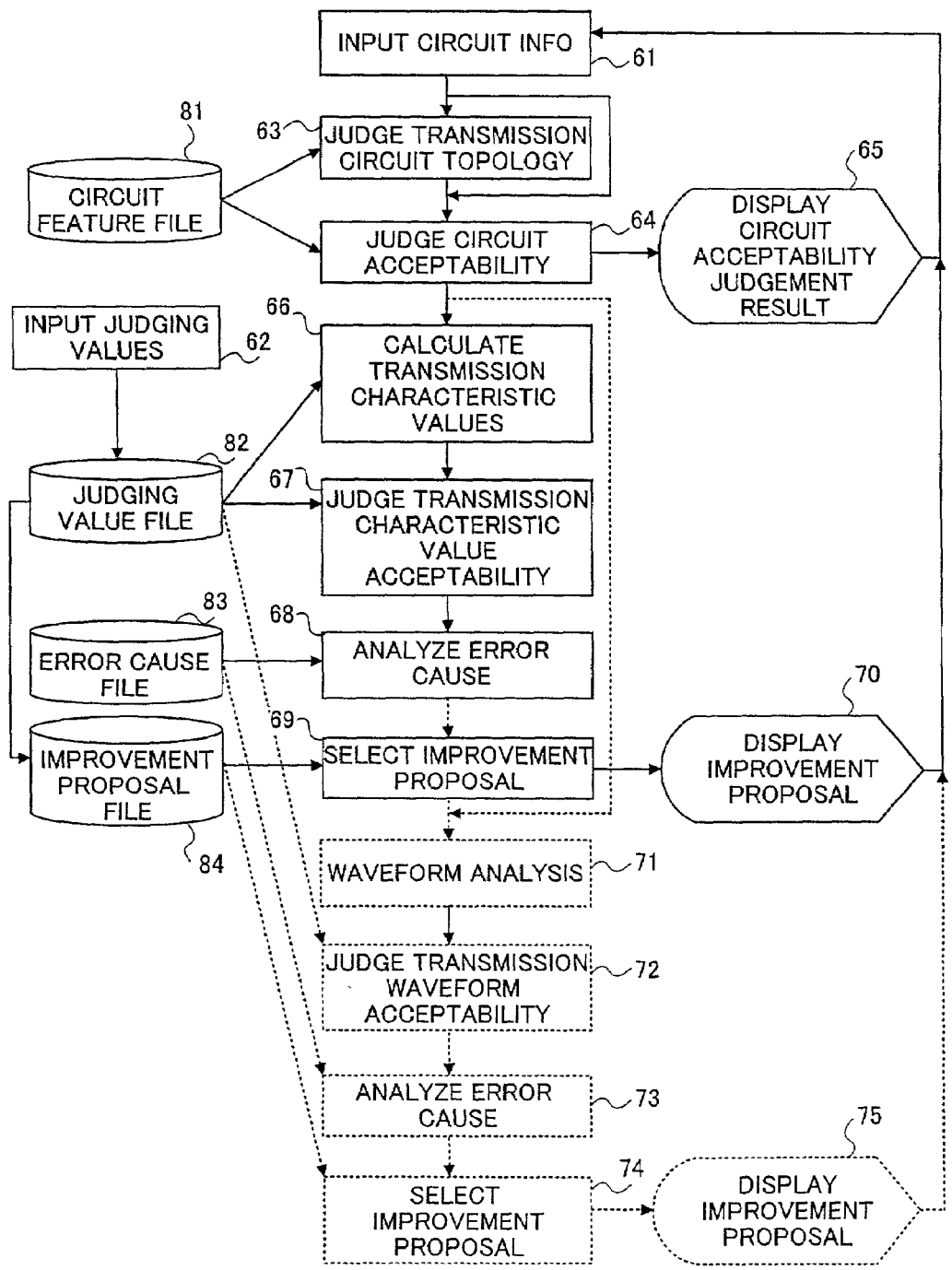
FIG. 27 is a flow chart for explaining a noise countermeasure determination process of the CPU in a tenth embodiment of the present invention.

FIG. 27 is a flow chart for explaining a noise countermeasure determination process of the CPU 201 of the computer system 100 which is applied with a tenth embodiment of the noise countermeasure determination method, a tenth embodiment of the noise countermeasure determination apparatus and a tenth embodiment of the computer-readable storage medium according to the present invention. In this embodiment, judging values for judging acceptability of a transmission waveform are input, and characteristic values for judging items are calculated depending on a transmission circuit topology of a circuit which is to be subjected to a transmission waveform analysis, so as to automatically judge whether or not the characteristic values fall within the judging values. If the characteristic values do not fall within the judging values as a result of this judgement, an optimum improvement proposal which makes the calculated characteristic values fall within the judging values is automatically selected from improvement proposals which are within an improvement proposal file and are dependent on the transmission circuit topology of the circuit which is to be subjected to the transmission waveform analysis.

In a case where results of the transmission waveform analysis are used as the judging items, the judging values for judging the acceptability of the transmission waveform are input, the circuit which is to be subjected to the transmission waveform analysis is analyzed using a transmission waveform analyzing tool, and a judgement is made to automatically judge whether or not the characteristic values fall within the judging values. If the characteristic values do not fall within the judging values as a result of this judgement, an optimum improvement proposal which makes the calculated characteristic values fall within the judging values is automatically selected from the improvement proposals which are within the improvement proposal file and are dependent on the transmission circuit topology of the circuit which is to be subjected to the transmission waveform analysis.

Because the characteristic values of the circuit are calculated without carrying out a transmission waveform analysis, the transmission circuit topology is judged by referring to a file which stores characteristics of the transmission circuit topologies, with respect to the circuit which is to be subjected to the transmission waveform analysis, so as to automatically judge which portions differ from basic types of the transmission circuit topologies. Based on this judgement, the portions which differ from the basic types of the transmission circuit topologies and how they differ, and how the portions may be modified in order to become the equal to the basic types, can be specified automatically.

In FIG. 27, a step 61 inputs information of a circuit which is to be subjected to the transmission waveform analysis (hereinafter simply referred to as an analyzing circuit). More particularly, wiring data of a printed circuit board and electrical characteristics of elements used, for example, are input with a predetermined format, so as to enable analysis of the analyzing circuit. The information of the analyzing circuit may be input by a first input method according to which the user creates and inputs the information of the analyzing circuit on the display screen 102a of the display 102 or, by a second input method according to which the information of the analyzing circuit is input from a CAD tool.

In the case of the first input method, an element model is arranged on the display screen 102a, for example, and elements are assigned to the element model to indicate the kinds of elements forming the element model. In this case, numerical values are input with respect to passive parts or the like. The elements are connected by wirings by manipulating the mouse 104 according to the user's design, and an impedance and a wiring length are input for each segment of the wirings. Dimensions of conductors and a thickness of an insulator layer are input from a cross sectional view of the printed circuit board, so that the impedance is automatically calculated therefrom and input.

On the other hand, in the case of the second input method, the information of the analyzing circuit can be input from a CAD tool to which information of elements and connection states of wirings connecting the elements are already input.

A step 62 generates and inputs judging values related to the transmission waveform for use in steps 67 and 72. As will be described later, the step 67 judges the acceptability of the transmission characteristic value, and the step 72 judges the acceptability of the transmission waveform. The input judging values are stored in a storage means such as the memory part 202 in a form of a judging value file 82. In addition to the judging values input by the step 62, the judging value file 82 prestores default values of judging values which are used for judging the acceptability of the analyzing circuit.

The step 62 inputs the judging values of different items, such as delay tolerance value and skew, for each analyzing circuit. In addition, control information made up of special conditions of the analyzing circuit, such as "no place to insert a termination end" and "a position of a part cannot be changed", may also be input as the judging values for use in selecting an improvement proposal which will be described later. The control information made up of the special conditions of the analyzing circuit is also stored in an improvement proposal file 84 which will be described later. On the other hand, the default values of the judging values stored in the judging value file 82 include default values of judging values of items used for judging the acceptability of waveforms output by the used elements, such as maximum rated values of the elements and voltage values for recognizing high and low levels of signals. In order to carry out the analysis by taking into account sufficient margins, the judging value file 82 may be constructed so that the default values of the judging values within the judging value file 82 can be changed by the user.

A circuit feature file 81 stores feature information which is used to judge the transmission circuit topology. For example, the circuit feature file 81 is stored in a storage means such as the memory part 202. A step 63 judges the transmission circuit topology based on the feature information stored in the circuit feature file 81. More particularly, the step 63 judges a category of the transmission circuit topology to which the analyzing circuit input by the step 61 belongs. A transmission circuit topology satisfying the feature information stored in the circuit feature file 81, that is, satisfying a largest number of items, is judged as being the transmission circuit topology of the analyzing circuit. The transmission circuit topology is categorized into basic types depending on the manner in which the wirings are connected, and the basic types include the "star type", "load concentration type", "daisy chain type" and the like. After the step 63, the process advances to a step 64.

In a case where the transmission circuit topology used by the user to construct the analyzing circuit is known beforehand, the process of the step 63 is unnecessary, and the process after the step 61 may advance directly to the step 64 in this case.

The step 64 reads from the circuit feature file 81 the feature information of the transmission circuit topology judged by the step 63 or the feature information of the transmission circuit topology specified by the user, and judges whether or not the analyzing circuit input by the step 61 satisfies the features of the transmission circuit topology, and judges whether or not the analyzing circuit needs to be improved in order to make the analyzing circuit closer to the basic type of the transmission circuit topology. For example, the items used for judging whether or not the analyzing circuit satisfies the features of the transmission circuit topology include "whether or not a wiring length between loads has such a value that may be regarded as a load concentration" in the case of the load concentration type, "whether or not wiring lengths from branching points after a branch to a load have such a difference that the lengths may be regarded as being equal" in the case of the star type, and "whether or not lengths of wirings branching from a main line have such values that may be regarded as a daisy chain" in the case of the daisy chain type.

In other words, the step 64 carries out a rule check and a topology check. The rule check judges whether or not the analyzing circuit satisfies basic items of the transmission circuit, based on comparisons of the corresponding items. On the other hand, the topology check judges whether or not the analyzing circuit satisfies the features of the transmission circuit topology assumed by the user, based on the comparisons of the corresponding items.

The analyzing circuit can be categorized into several transmission circuit topologies depending on the manner in which the wirings are connected, and the transmission waveform differs for each of the transmission circuit topologies. In other words, an improvement proposal for the transmission waveform differs depending on the transmission circuit topology, and a transmission waveform improvement proposal for a certain transmission circuit topology may in some cases deteriorate the transmission waveform for another transmission circuit topology. Hence, because the transmission circuit topology is an important element from the point of view of generating the improvement proposal, this embodiment determines the category or type of the transmission circuit topology to which the analyzing circuit belongs based on the features of the transmission circuit topologies.

A step 65 displays judgement results of circuit acceptability, with respect to the features of the transmission circuit topology not satisfied by the analyzing circuit, on the display screen 102a of the display 102, and the process returns to the step 61. The judgement results of the circuit acceptability include information related to each portion which does not satisfy the features and the reason why, information related to each difference from the corresponding judging value, information related to how each feature may be satisfied, and the like. Accordingly, in the step 61, the user corrects the basic items of the analyzing circuit based on the displayed judgement results of the circuit acceptability.

A step 66 calculates transmission characteristic values of the analyzing circuit which satisfies the features of the transmission circuit topology in the step 64, based on calculation formulas which are prepared for each transmission circuit topology stored in the judging value file 82. For example, the calculation formulas are used to calculate the transmission characteristic values, such as a voltage value of a signal reaching a receiver element, a time required for a signal to reach a receiver element, a voltage value of a waveform reaching a receiver element after being reflected by the receiver element and further reflected by a driver element, and a time required for a waveform to reach a receiver element after being reflected by the receiver element and further reflected by a driver element, from a driven ability of a driver element, a wiring impedance, a damping resistance and the like of the analyzing circuit. The calculation formulas which are used are selected depending on the transmission circuit topology.

With respect to the analyzing circuit, a step 67 compares the transmission characteristic values calculated by the step 66 and the judging values stored in the judging value file 82, so as to automatically judge the acceptability of the transmission characteristic values. More particularly, the step 67 judges whether or not the transmission characteristic values such as the calculated voltage values and times satisfy the judging values, and if it is judged that the judging values are not satisfied, it can be seen that the analyzing circuit needs to be improved.

A step 68 analyzes a cause of an error (hereinafter referred to as an error cause) depending on a combination of items for which the transmission characteristic values do not satisfy the judging values when the step 67 judges the acceptability of the transmission characteristic values. The error cause is analyzed by referring to error items and an error cause judging tree which are stored in an error cause file 83. For example, the error cause file 83 is stored in a storage means such as the memory part 202. The error cause judging tree categorizes the error cause in a form of a tree, and describes the error cause by the error items and the combination of the error items. Accordingly, it is possible to analyze what the error cause is, by referring to the error cause judging tree within the error cause file 83 when analyzing the error cause.

In other words, in a case where the transmission characteristic values do not satisfy the judging values when the step 67 judges the acceptability of the transmission characteristic values, the transmission circuit topology of the analyzing circuit which does not satisfy the judging values, the combination of the items for which the judging values are not satisfied, the difference from the judging value and the like are used as keys when referring to the error cause judging tree within the error cause file 83, so as to specify the error cause. For example, if the transmission circuit topology is the 1:1 type and the error is caused by a stepped portion generated in the transmission waveform, the error cause of the transmission waveform having the stepped portion is specified as being a large damping resistance or a small driven ability of the driver element.

If there is an item for which the judging value is not satisfied as a result of the step 67 which judges the acceptability of the transmission characteristic values, a step 69 reads the error cause obtained by the step 68, including which item is not satisfied, the extent to which the judging value is exceeded, and the like. The step 69 selects an optimum improvement proposal from improvement proposals stored in an improvement proposal file 84, based on the combination of the items which do not satisfy the judging values and the extents to which the judging values are exceeded. For example, the improvement proposal file 84 is stored in a storage means such as the memory part 202. The improvement proposal file 84 stores improvement proposals depending on combinations of the error causes, such as the transmission circuit topology, the item for which the judging value is exceeded, and the extent to which the judging value is exceeded. The improvement proposals within the improvement proposal file 84 are inspected beforehand by a waveform analysis or the like, and the judging values will not be exceeded for the other judging items when the optimum improvement proposal is selected.

In other words, if the transmission characteristic value is judged as being unacceptable as a result of judging the acceptability of the transmission characteristic value, the error cause is analyzed from the judging items, and the optimum improvement proposal is selected from the improvement proposal file 84. If a judging item is generated for which it is judged that the transmission characteristic value is not acceptable, the improvement proposal may be to reduce the damping resistance, to change the driver element to a driver element having a larger driven ability or the like, for example. Hence, if the damping resistance can be reduced, the improvement proposal to change (reduce) the damping resistance is selected as the optimum improvement proposal, and if the transmission characteristic value is not acceptable even if the damping resistance is eliminated, the improvement proposal to change the driver element is selected as the optimum improvement proposal. That is, by preparing within the improvement proposal file 84 a selection tree which is dependent on the situations, it is possible to select the optimum improvement proposal from the selection tree.

A step 70 displays on the display screen 102a of the display 102 the optimum improvement proposal selected by the step 69, that is, a noise countermeasure. The displayed improvement proposal includes information related to each portion which does not satisfy the judging values and the reason why, information related to each difference from the corresponding judging value, information related to how each judging value may be satisfied, and the like. After the step 70, the process returns to the step 61. Accordingly, in the step 61, the user corrects the corresponding items of the analyzing circuit based on the displayed improvement proposal. Of course, it is possible for the user not to correct the corresponding items of the analyzing circuit at this stage, but instead to first obtain an analysis result of the transmission waveform which will be described later, and to then correct the corresponding items of the analyzing circuit based on the improvement proposal and the analysis result of the transmission waveform.

The transmission characteristic values can be calculated from the calculation formulas of the transmission characteristic values obtained from the circuit theory, the closer the analyzing circuit is to the basic type of the transmission circuit topology. Hence, it is possible to obtain the transmission characteristic values for use in judging the acceptability of the analyzing circuit, without having to carry out a waveform analysis for each improvement proposal. For this reason, by comparing the analyzing circuit and the basic type of the categorized transmission circuit topology, and urging the user to make the analyzing circuit closer to the basic type by generating an improvement proposal if there is a portion which greatly differs from the basic type, it becomes possible to judge the acceptability of the analyzing circuit without carry out a waveform analysis, to thereby reduce the processing time. In addition, since the analyzing circuit is closer to the basic type of the transmission circuit topology, it is easier to generate an appropriate improvement proposal, and it is possible to automatically generate an improvement proposal which is unaffected by the degree of skill of the user.

After judging the acceptability of the analyzing circuit in the step 64, it is possible to omit the steps 66 through 70 and to advance the process to the step 71 which carries out the waveform analysis which will be described later, as indicated by a dotted arrow in FIG. 27.

The step 71 uses a transmission waveform analyzing tool, and obtains an analysis result of the transmission waveform by simulating the transmission waveform. For example, the analysis result of the transmission waveform obtained by this simulation includes a stepped portion, an overshoot, an undershoot, a waveform discontinuity, an exceeded delay time and the like of the transmission waveform.

A step 72 automatically judges the acceptability of the transmission waveform by comparing the analysis result of the transmission waveform obtained by the step 71 and the judging values stored in the judging value file 82. More particularly, a judgement is made to determine whether or not the voltage values, the times and the like within the analysis result satisfy the corresponding judging values, and it is found that the analyzing circuit needs to be improved if the analysis result does not satisfy the judging values.

A step 73 analyzes an error cause depending on a combination of items for which the transmission waveform does not satisfy the judging values when the step 72 judges the acceptability of the transmission waveform. The error cause is analyzed by referring to error items and an error cause judging tree which are stored in the error cause file 83. The error cause judging tree categorizes the error cause in a form of a tree, and describes the error cause by the error items and the combination of the error items. Accordingly, it is possible to analyze what the error cause is, by referring to the error cause judging tree within the error cause file 83 when analyzing the error cause.

In other words, in a case where the transmission waveform does not satisfy the judging values when the step 72 judges the acceptability of the transmission waveform, the transmission circuit topology of the analyzing circuit which does not satisfy the judging values, the combination of the items for which the judging values are not satisfied, the difference from the judging value and the like are used as keys when referring to the error cause judging tree within the error cause file 83, so as to specify the error cause. For example, if the transmission circuit topology is the daisy chain type and the error is caused by an exceeded delay time and a stepped portion of the transmission waveform, the error cause of the transmission waveform having the exceeded delay time is specified as being the stepped portion generated in the transmission waveform, and the error cause of the transmission waveform having the stepped portion is specified as being a position of a judged receiver element which branches halfway from a main line and is too distant from a remote end receiver element thereby generating the exceeded delay time due to the stepped portion which extends for a long time.

If there is an item for which the judging value is not satisfied as a result of the step 72 which judges the acceptability of the transmission waveform, a step 74 reads the error cause obtained by the step 73, including which item is not satisfied, the extent to which the judging value is exceeded, and the like. The step 74 selects an optimum improvement proposal from improvement proposals stored in the improvement proposal file 84, based on the combination of the items which do not satisfy the judging values and the extents to which the judging values are exceeded.

In other words, if the transmission waveform is judged as being unacceptable as a result of judging the acceptability of the transmission waveform, the error cause is analyzed from the judging items, and the optimum improvement proposal is selected from the improvement proposal file 84. If a judging item is generated for which it is judged that the transmission waveform is not acceptable, the improvement proposal may be to move the position of the judged receiver element towards the remote end so as to shorten the time of the stepped portion, to provide a terminating resistor so as not to reflect the transmission waveform at the remote end receiver element, or the like, for example. Hence, under a condition in which the position of the receiver element cannot be changed, the improvement proposal to provide the terminating resistor is selected as the optimum improvement proposal, and under a condition in which the terminating resistor cannot be provided, the improvement proposal to change the position of the receiver element is selected as the optimum improvement proposal, based on control information which is made up of special conditions of the analyzing circuit and is input by the step 62 and stored in the improvement proposal file 84. That is, by preparing within the improvement proposal file 84 a selection tree which is dependent on the situations, it is possible to select from the selection tree the optimum improvement proposal which takes into consideration the design restrictions.

A step 75 displays on the display screen 102a of the display 102 the optimum improvement proposal selected by the step 74, that is, a noise countermeasure. The displayed improvement proposal includes information related to each portion which does not satisfy the judging values and the reason why, information related to each difference from the corresponding judging value, information related to how each judging value may be satisfied, and the like. After the step 75, the process returns to the step 61. Accordingly, in the step 61, the user corrects the corresponding items of the analyzing circuit based on the displayed improvement proposal.

Figure 28:
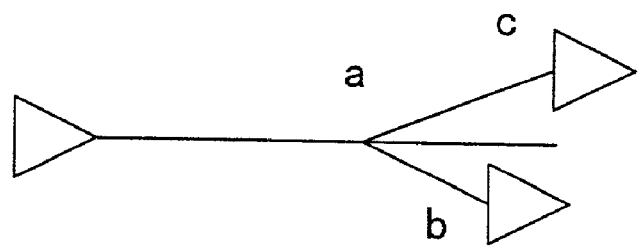
FIG. 28 is a diagram showing a 1:2 type analyzing circuit having a star type transmission circuit topology.

Next, a description will be given of the process of this embodiment for a case where the analyzing circuit is a 1:2 type having the star type transmission circuit topology, by referring to FIGS. 28 through 31. FIG. 28 is a diagram showing a 1:2 type analyzing circuit having the star type transmission circuit topology. In FIG. 28, a triangular symbol indicates an element, and one element located on the left side indicates a driver element while two elements located on the right side indicate receiver elements. In addition, a, b and c in FIG. 28 denote nodes.

Figure 29:
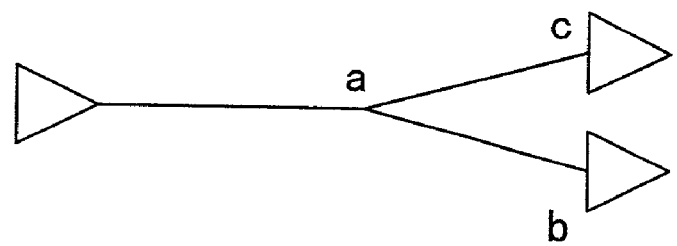
FIG. 29 is a diagram showing an analyzing circuit which is improved as a result of judging acceptability of the analyzing circuit shown in FIG. 28.

In this case, it is found that there is an antenna pattern which has no element connected thereto, as a result of the process carried out by the step 64 which judges the acceptability of the analyzing circuit. Consequently, the step 65 displays a circuit acceptability judgement result "Please delete the antenna pattern from the node a". In addition, it is also found that the wiring lengths from the node a to each of the two receiver elements are different even though the transmission circuit topology is the star type, as a result of the process carried out by the step 64 which judges the acceptability of the analyzing circuit. Accordingly, the step 65 also displays a circuit acceptability judgement result "Please change the wiring between nodes a and b to the same length as the wiring between the nodes a and c". When the user corrects the analyzing circuit based on these circuit acceptability judgement results which are displayed, the analyzing circuit shown in FIG. 28 is improved to an analyzing circuit shown in FIG. 29. FIG. 29 is a diagram showing the analyzing circuit which is improved as a result of judging the acceptability of the analyzing circuit shown in FIG. 28.

Figure 30:
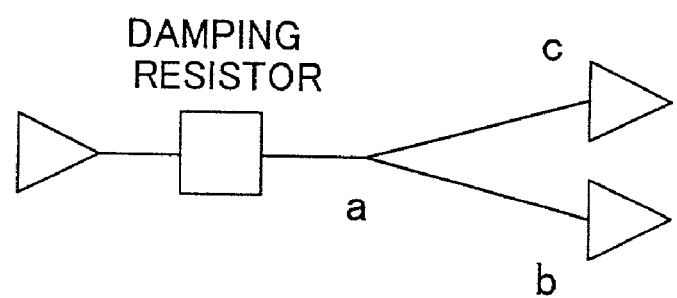
FIG. 30 is a diagram showing an analyzing circuit which is improved as a result of judging acceptability of transmission characteristic values of the analyzing circuit shown in FIG. 29.

Suppose that in the analyzing circuit shown in FIG. 29, the driver element used has an extremely large driven ability. In this case, when the step 66 calculates star type receiver element voltages as the transmission characteristic values, it is found that the receiver element voltages exceed the maximum rated voltage of the receiver element. Accordingly, as a result of judging the acceptability of the transmission characteristic values in the step 67, analyzing the error cause in the step 68 and selecting the improvement proposal in the step 69, the step 70 displays an improvement proposal "Please insert a damping resistor having a resistance of X $\Omega$ between the driver element and the node a". When the user corrects (improves) the analyzing circuit based on this improvement proposal, the analyzing circuit shown in FIG. 29 is improved to an analyzing circuit shown in FIG. 30. FIG. 30 is a diagram showing the analyzing circuit which is improved as a result of judging the acceptability of the transmission characteristic values of the analyzing circuit shown in FIG. 29. In FIG. 30, a square symbol indicates a damping resistor.

Figure 31:
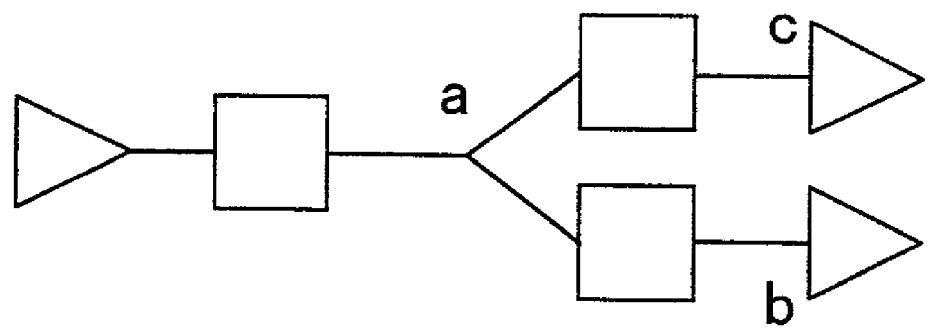
FIG. 31 is a diagram showing an analyzing circuit which is improved as a result of judging acceptability of transmission waveform of the analyzing circuit shown in FIG. 30.

Suppose that in the analyzing circuit shown in FIG. 30, a difference between input capacitances of the receiver elements is large and a stepped portion is generated in the transmission waveform. In this case, the stepped portion of the transmission waveform is detected by the transmission waveform analysis of the step 71, and as a result of judging the acceptability of the transmission waveform in the step 72, analyzing the error cause in the step 73 and selecting the improvement proposal in the step 74, the step 75 displays an improvement proposal "Please insert a resistor having a resistance Y $\Omega$ between the nodes a and b and between the nodes a and c". When the user corrects (improves) the analyzing circuit based on this improvement proposal, the analyzing circuit shown in FIG. 30 is improved to an analyzing circuit shown in FIG. 31. FIG. 31 is a diagram showing the analyzing circuit which is improved as a result of judging the acceptability of the transmission waveform of the analyzing circuit shown in FIG. 30. In FIG. 31, each square symbol indicates a resistor.

Figure 32:
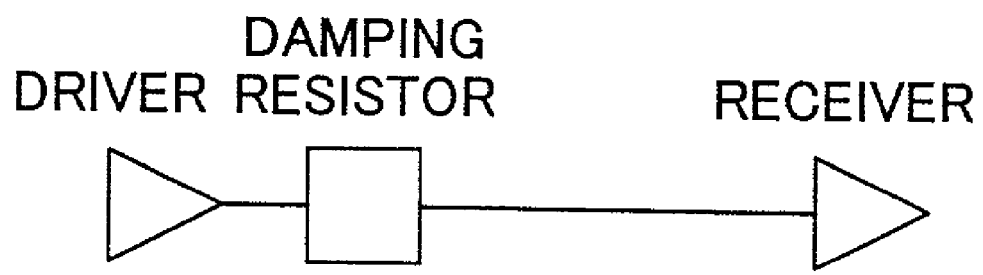
FIG. 32 is a diagram showing an analyzing circuit which is analyzed of the error cause.

Next, a description will be given of a particular error cause analysis of the step 68, by referring to FIGS. 32 through 34. For the sake of convenience, a description will be given of the error cause analysis for a case where the transmission circuit topology of the analyzing circuit is a 1:1 type and it is judged that a voltage of a receiver element is small as a result of judging the acceptability of the transmission characteristic values. FIG. 32 is a diagram showing an analyzing circuit which is analyzed of the error cause. The analyzing circuit shown in FIG. 32 includes a driver element which is indicated by a triangular symbol, a damping resistor which is indicated by a square symbol, and a receiver element which is indicated by a triangular symbol.

The error cause is analyzed for each transmission circuit topology, such as the 1:1 type, star type and the daisy chain type. FIG. 33 is a diagram showing analyzing items of the error cause for a 1:1 type transmission circuit topology. Of the analyzing items shown in FIG. 33, an analyzing item "Small Receiver Voltage" indicates that a voltage of the receiver element which is small, an analyzing item "Exceeded Maximum Rated Voltage" indicates that the maximum rated voltage is exceeded, and an analyzing item "Exceeded Delay" indicates that the delay time is exceeded. Further, each analyzing item corresponding to the error cause on the right is marked with a symbol "x". For example, the error cause corresponding to the analyzing item "Exceeded Delay" is "The wiring is long".

FIG. 34 is a diagram for explaining a part within the improvement proposal file 84 for the case of FIGS. 32 and 33. As shown in FIG. 34, in the improvement proposal file 84, the improvement proposal is written as a "countermeasure proposal" with respect to each error cause, and a judgement by a selection tree depending on the situation is written as a "tree judgement". For example, the countermeasure proposal with respect to the error cause "The wiring is long" is "Shorten the wiring length", and there is no particular tree judgement.

Figure 35:
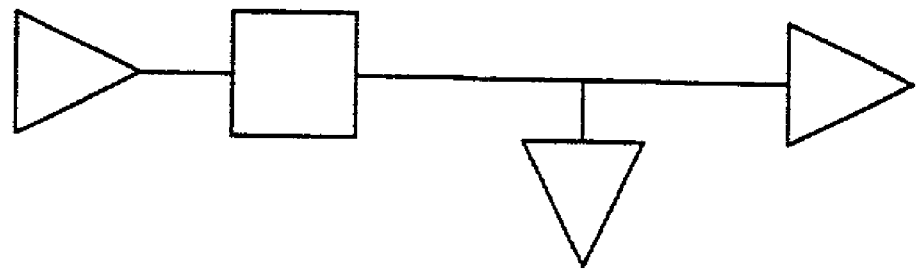
FIG. 35 is a diagram showing an analyzing circuit which is analyzed of the error cause.

Next, a description will be given of a particular error cause analysis of the step 73, by referring to FIGS. 35 through 37. For the sake of convenience, a description will be given of the error cause analysis for a case where the transmission circuit topology of the analyzing circuit is a daisy chain type and it is judged that the delay time is exceeded and the stepped portion is generated in the transmission waveform as a result of judging the acceptability of the transmission waveform. FIG. 35 is a diagram showing the analyzing circuit which is analyzed of the error cause. In FIG. 35, the analyzing circuit includes a driver element indicated by a triangular symbol, a damping resistor indicated by a square symbol, and two receiver elements respectively indicated by a triangular symbol.

The error cause is analyzed for each transmission circuit topology such as the 1:1 type, the star type and the daisy chain type. FIG. 36 is a diagram showing analyzing items of the error cause for a daisy chain type transmission circuit topology. Of the analyzing items shown in FIG. 36, an analyzing item "Stepped Portion" indicates that a stepped portion is generated in the transmission waveform, an analyzing item "Waveform Discontinuity" indicates that a discontinuity is generated in the transmission waveform, and an analyzing item "Exceeded Delay" indicates that the delay time is exceeded. Further, each analyzing item corresponding to the error cause on the right is marked with a symbol "x". For example, the error cause corresponding to both the analyzing items "Stepped Portion" and "Exceeded Delay" is "A stepped portion is generated".

FIG. 37 is a diagram for explaining a part within the improvement proposal file 84 for the case of FIGS. 35 and 36. As shown in FIG. 37, in the improvement proposal file 84, the improvement proposal is written as a "countermeasure proposal" with respect to each error cause, and control information made up of special conditions of the analyzing circuit is written as a "special condition". For example, one countermeasure proposal with respect to the error cause "A stepped portion is generated" is "Reduce resistance of damping resistor", and a corresponding special condition is "Cannot provide terminating resistor".

Compared to the third embodiment shown in FIG. 8, the step 61 of this embodiment shown in FIG. 27 generally corresponds to the step 1 shown in FIG. 8, the step 69 generally corresponds to the step 5 shown in FIG. 8, the step 70 generally corresponds to the step 6 shown in FIG. 8, the step 71 generally corresponds to the steps 7 and 8 shown in FIG. 8, the step 72 generally corresponds to the step 9 shown in FIG. 8, the steps 73 and 74 generally correspond to the step 10 shown in FIG. 8, and the step 75 generally corresponds to the step 11 shown in FIG. 8. Furthermore, compared to the eighth embodiment shown in FIG. 22, the step 64 of this embodiment shown in FIG. 27 generally correspond to the steps 41 and 43 shown in FIG. 22.

Therefore, this embodiment categorizes the analyzing circuit for each transmission circuit topology to optimize the improvement proposal, so that the processing time required to select the optimum improvement proposal is shortened. Moreover, the improvement proposal can be optimized automatically, before or after the transmission waveform analysis, thereby enabling the optimum improvement proposal to be generated without being affected by the degree of skill of the user.

On the other hand, when optimizing the improvement proposal after the transmission waveform analysis, it is possible to first optimize the improvement proposal by categorizing the analyzing circuit by the transmission circuit topology, and to then optimize the improvement proposal based on the result of the transmission waveform analysis such as depending on the combination of the error contents, for example. Hence, the optimum improvement proposal can be selected automatically in two stages within a short processing time.

Therefore, according to the tenth embodiment described above, the improvement proposal for the analyzing circuit is selected automatically, and thus, the optimum improvement proposal can be selected regardless of the degree of skill of the user. In addition, since the improvement proposal is categorized for each transmission circuit topology, the transmission characteristics of the analyzing circuit can be calculated based on calculation formulas, without analyzing the transmission waveform, to thereby shorten the processing time. When the improvement proposal is automatically optimized using the judgement result of the transmission characteristics, it is possible to select the optimum improvement proposal. Moreover, because the improvement proposal is categorized for each transmission circuit topology, the improvement proposal can be optimized with ease, and it is easy to find the optimum improvement proposal. Thus, the processing time can also be shorted from this point of view, and the accuracy of the improvement proposal can also be improved.

Further, the present invention is not limited to these embodiments, but various variations and modifications may be made without departing from the scope of the present invention.

What is claimed is:

1. A noise countermeasure determination method by a computer for determining a noise countermeasure with respect to an analyzing circuit that is to be analyzed for a user of the circuit, comprising:

obtaining an analyzing circuit judgement result by the computer by judging acceptability of the analyzing circuit based on a comparison of features of the analyzing circuit and a plurality of transmission circuit topologies into which the analyzing circuit is categorizable depending on manners in which wirings are connected, wherein a transmission waveform of the analyzing circuit differs depending on each of the transmission circuit topologies; and outputting an improvement proposal from the computer to the user for making the analyzing circuit closer to one of basic types of the transmission circuit topologies depending on the analyzing circuit judgement result.

2. The noise countermeasure determination method as claimed in claim 1, further comprising:

calculating transmission characteristic values of the analyzing circuit based on calculation formulas depending on the judgement result of said obtaining an analyzing circuit judgement and the transmission circuit topologies;

obtaining a characteristic value judgement result by judging acceptability of the transmission characteristic values, based on judging values;

analyzing an error cause by referring to an error cause file which indicates the error causes depending on error items, using the characteristic value judgement result; and selecting and outputting an improvement proposal by referring to an improvement proposal file which indicates improvement proposals depending on the error causes, using the error cause analyzed by said analyzing an error cause.

3. The noise countermeasure determination method as claimed in claim 2, further comprising:

analyzing the transmission waveform of the analyzing circuit using a waveform analyzing tool;

obtaining a waveform judgement result by judging acceptability of the transmission waveform, based on the judging values;

analyzing the error cause by referring to the error cause file, using the waveform judgement result; and selecting and outputting an improvement proposal by referring to an improvement proposal file which indicates improvement proposals depending on the error causes, using the error cause analyzed by said analyzing the error cause.

4. The error countermeasure determination method as claimed in claim 1, further comprising:

analyzing the transmission waveform of the analyzing circuit using a waveform analyzing tool;

obtaining a waveform judgement result by judging acceptability of the transmission waveform, based on judging values;

analyzing an error cause by referring to an error cause file which indicates the error causes depending on error items, using the waveform judgement result; and selecting and outputting an improvement proposal by referring to the improvement proposal file, using the error cause analyzed by said analyzing an error cause.

5. The noise countermeasure determination method as claimed in claim 1, further comprising:

judging the transmission circuit topology of the analyzing circuit, by referring to a circuit feature file which stores feature information used for judging the transmission circuit topology.

6. A noise countermeasure determination apparatus for determining a noise countermeasure for a user with respect to an analyzing circuit that is to be analyzed, said noise countermeasure determination apparatus comprising:

a circuit acceptability judging and output part configured to obtain an analyzing circuit judgement result by judging acceptability of the analyzing circuit based on a comparison of features of the analyzing circuit and a plurality of transmission circuit topologies into which the analyzing circuit is categorizable depending on manners in which wiring are connected, wherein a transmission waveform of the analyzing circuit differs depending on each of the transmission circuit topologies, and to output an improvement proposal to the user for making the analyzing circuit closer to one of basic types of the transmission circuit topologies depending on the analyzing circuit judgement result.

7. The noise countermeasure determination apparatus as claimed in claim 6, further comprising:

a calculating part configured to output transmission characteristic values of the analyzing circuit based on calculation formulas depending on the judgement result of said circuit acceptability judging and output part and the transmission circuit topologies;

a characteristic value judging part configured to obtain a characteristic value judgement result by judging acceptability of the transmission characteristic values, based on judging values;

a first error cause analyzing part configured to analyze an error cause by referring to an error cause file which indicates the error causes depending on error items, using the characteristic value judgement result; and a first improvement proposal selecting and outputting part configured to select and output an improvement proposal by referring to an improvement proposal file which indicates improvement proposals depending on the error causes, using the error cause analyzed by said first error cause analyzing part.

8. The noise countermeasure determination apparatus as claimed in claim 7, further comprising:

a waveform analyzing part configured to analyze the transmission waveform of the analyzing circuit using a waveform analyzing tool;

a waveform judging part configured to obtain a waveform judgement result by judging acceptability of the transmission waveform, based on the judging values;

a second error cause analyzing part configured to analyze the error cause by referring to the error cause file, using the waveform judgement result; and a second improvement proposal selecting and outputting part configured to select and output an improvement proposal by referring to an improvement proposal file which indicates improvement proposals depending on the error causes, using the error cause analyzed by said second error cause analyzing part.

9. The error countermeasure determination apparatus as claimed in claim 6, further comprising:

a waveform analyzing part configured to analyze the transmission waveform of the analyzing circuit using a waveform analyzing tool;

a waveform judging part configured to obtain a waveform judgement result by judging acceptability of the transmission waveform, based on judging values;

an error cause analyzing part configured to analyze an error cause by referring to an error cause file which indicates the error causes depending on error items, using the waveform judgement result; and an improvement proposal selecting and outputting part configured to select and output an improvement proposal by referring to the improvement proposal file, using the error cause analyzed by said error cause analyzing part.

10. The noise countermeasure determination apparatus as claimed in claim 6, further comprising:

a topology judging part configured to judge the transmission circuit topology of the analyzing circuit, by referring to a circuit feature file which stores feature information used for judging the transmission circuit topology.

11. A computer-readable storage medium which stores a program for causing a computer to determine a noise countermeasure for a user with respect to an analyzing circuit that is to be analyzed, said program comprising:

a circuit acceptability judging and output procedure which causes the computer to obtain an analyzing circuit judgement result by judging acceptability of the analyzing circuit based on a comparison of features of the analyzing circuit and a plurality of transmission circuit topologies into which the analyzing circuit is categorizable depending on manners in which wirings are connected, wherein a transmission waveform of the analyzing circuit differs depending on each of the transmission circuit topologies, and to output an improvement proposal to the user for making the analyzing circuit closer to one of basic types of the transmission circuit topologies depending on the analyzing circuit judgement result.

12. The computer-readable storage medium as claimed in claim 11, wherein said program further comprises:
    a calculating procedure which causes the computer to calculate transmission characteristic values of the analyzing circuit based on calculation formulas depending on the judgement result of said circuit acceptability judging and output means and the transmission circuit topologies;
    a characteristic value judging procedure which causes the computer to obtain a characteristic value judgement result by judging acceptability of the transmission characteristic values, based on judging values;
    a first error cause analyzing procedure which causes the computer to analyze an error cause by referring to an error cause file which indicates the error causes depending on error items, using the characteristic value judgement result; and
    a first improvement proposal selecting and outputting procedure which causes the computer to select and output an improvement proposal by referring to an improvement proposal file which indicates improvement proposals depending on the error causes, using the error cause analyzed by said first error cause analyzing means.

13. The computer-readable storage medium as claimed in claim 12, wherein said program further comprises:
    a waveform analyzing procedure which causes the computer to analyze the transmission waveform of the analyzing circuit using a waveform analyzing tool;
    a waveform judging procedure which causes the computer to obtain a waveform judgement result by judging acceptability of the transmission waveform, based on the judging values;
    a second error cause analyzing procedure which causes the computer to analyze the error cause by referring to the error cause file, using the waveform judgement result; and
    a second improvement proposal selecting and outputting procedure which causes the computer to select and output an improvement proposal by referring to an improvement proposal file which indicates improvement proposals depending on the error causes, using the error cause analyzed by said second error cause analyzing means.

14. The computer-readable storage medium as claimed in claim 11, wherein said program further comprises:
    a waveform analyzing procedure which causes the computer to analyze the transmission waveform of the analyzing circuit using a waveform analyzing tool;
    a waveform judging procedure which causes the computer to obtaining a waveform judgement result by judging acceptability of the transmission waveform, based on judging values;
    an error cause analyzing procedure which causes the computer to analyze an error cause by referring to an error cause file which indicates the error causes depending on error items, using the waveform judgement result; and
    an improvement proposal selecting and outputting procedure which causes the computer to select and output an improvement proposal by referring to the improvement proposal file, using the error cause analyzed by said error cause analyzing means.

15. The computer-readable storage medium as claimed in claim 11, wherein said program further comprises:
    a topology judging procedure which causes the computer to judge the transmission circuit topology of the analyzing circuit, by referring to a circuit feature file which stores feature information used for judging the transmission circuit topology.

16. A method for determining a noise countermeasure by a computer for a user of an analyzing circuit, the method comprising:
    categorizing the analyzing circuit by the computer into a plurality of transmission circuit wiring topologies depending on manners in which wirings are connected, wherein a transmission waveform of the analyzing circuit differs depending on each of the topologies;
    comparing features of the analyzing circuit and the topologies by the computer; and
    outputting a noise countermeasure improvement proposal from the computer to the user for making the analyzing circuit closer to one of basic types of the topologies based on the comparison.

17. A circuit topology for a noise countermeasure improvement proposal for a user of an analyzing circuit, comprising:
    a circuit topology selectable by a computer from a plurality of transmission circuit topologies and outputted as a noise counter measure improvement proposal to the user,
    wherein a transmission waveform of the analyzing circuit differs depending on each of the plurality of transmission circuit topologies, and the selected circuit topology which is outputted to the user, results in a lower noise than other of the plurality of transmission circuit topologies.

18. The circuit topology according to claim 17, wherein the circuit topology is only for a printed circuit board.

* * * * *